(12) United States Patent
Horikiri

(10) Patent No.: US 12,104,279 B2
(45) Date of Patent: Oct. 1, 2024

(54) NITRIDE CRYSTAL SUBSTRATE AND METHOD FOR MANUFACTURING THE SAME

(71) Applicant: SUMITOMO CHEMICAL COMPANY, LIMITED, Tokyo (JP)

(72) Inventor: Fumimasa Horikiri, Ibaraki (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 13 days.

(21) Appl. No.: 17/649,983

(22) Filed: Feb. 4, 2022

(65) Prior Publication Data
US 2022/0154367 A1 May 19, 2022

Related U.S. Application Data

(63) Continuation of application No. 16/435,628, filed on Jun. 10, 2019, now Pat. No. 11,377,756.

(30) Foreign Application Priority Data

Jun. 13, 2018 (JP) ................................ 2018-112844

(51) Int. Cl.
C30B 29/40 (2006.01)
C01B 21/06 (2006.01)
(Continued)

(52) U.S. Cl.
CPC ........ *C30B 29/406* (2013.01); *C01B 21/0632* (2013.01); *G01N 21/95* (2013.01);
(Continued)

(58) Field of Classification Search
None
See application file for complete search history.

(56) References Cited

U.S. PATENT DOCUMENTS

2008/0193363 A1 8/2008 Tsuji
2012/0034149 A1 2/2012 Fujiwara et al.
(Continued)

FOREIGN PATENT DOCUMENTS

CN 110691867 A 1/2020
CN 110832630 A 2/2020
(Continued)

OTHER PUBLICATIONS

Horikiri, et al. "Nondestructive measurement of homoepitaxially grown GaN film thickness with Fourier transform infrared spectroscopy". Japanese Journal of Applied Physics. 56, 120301 (2017). (Year: 2017).*

(Continued)

*Primary Examiner* — Sheng H Davis
(74) *Attorney, Agent, or Firm* — Pearne & Gordon LLP

(57) ABSTRACT

There is provided a nitride crystal substrate constituted by group-III nitride crystal, containing n-type impurities, with an absorption coefficient α being approximately expressed by equation (1) by a least squares method in a wavelength range of at least 1 μm or more and 3.3 μm or less.

$$\alpha = N_e K \lambda^a \text{ (where } 1.5 \times 10^{-19} \leq K \leq 6.0 \times 10^{-19}, a = 3), \quad (1)$$

here, a wavelength is λ (μm), an absorption coefficient of the nitride crystal substrate at 27° C. is α (cm$^{-1}$), a carrier concentration in the nitride crystal substrate is $N_e$ (cm$^{-3}$), and K and a are constants, wherein an error of an actually measured absorption coefficient with respect to the absorption coefficient α obtained from equation (1) at a wavelength of 2 μm is within +0.1α, and in a reflection spectrum measured by irradiating the nitride crystal substrate with infrared light, there is no (Continued)

peak with a peak top within a wavenumber range of 1,200 cm$^{-1}$ or more and 1,500 cm$^{-1}$ or less.

5 Claims, 9 Drawing Sheets

(51) Int. Cl.
*G01N 21/95* (2006.01)
*H01L 21/02* (2006.01)
*C30B 25/02* (2006.01)
*G01N 21/84* (2006.01)

(52) U.S. Cl.
CPC .... *H01L 21/02389* (2013.01); *C01P 2002/82* (2013.01); *C01P 2006/40* (2013.01); *C30B 25/02* (2013.01); *G01N 2021/8477* (2013.01)

(56) References Cited

U.S. PATENT DOCUMENTS

| | | |
|---|---|---|
| 2012/0295428 A1 | 11/2012 | Melnik et al. |
| 2014/0255705 A1* | 9/2014 | Nepal ............... C30B 25/183 117/90 |
| 2020/0208297 A1 | 7/2020 | Horikiri |
| 2020/0388546 A1 | 12/2020 | Horikiri |
| 2021/0215621 A1 | 7/2021 | Horikiri |

FOREIGN PATENT DOCUMENTS

| | | |
|---|---|---|
| CN | 112105763 A | 12/2020 |
| JP | 2011-256082 A | 12/2011 |
| JP | 2015-185576 A | 10/2015 |

OTHER PUBLICATIONS

Barker, A. S., et al., "Infrared Lattice Vibrations and Free-Electron Dispersion in GaN", Physical Review B, Jan. 15, 1973, pp. 743-750, vol. 7, No. 2.

Perlin, P., et al., "Towards the Identification of the Dominant Donor in GaN", Physical Review Letters, Jul. 10, 1995, pp. 296-299, vol. 75, No. 2.

Bentoumi, G., et al. "Influence of Si doping level on the Raman and IR reflectivity spectra and optical absorption spectrum of GaN", Materials Science and Engineering B50 (1997) pp. 142-147.

Porowski, Sylwester, "Bulk and homoepitaxial GaN-growth and characterisation", Journal of Crystal Growth 189/190 (1998) pp. 153-158.

Van De Walle, Chris G., "Effects of impurities on the lattice parameters of GaN", Physical Review B 68, 165209, pp. 1-5 (2003).

Polyakov, A. Y., et al., "Hydride vapor phase GaN films with reduced density of residual electrons and deep traps", AIP Journal of Applied Physics, 115, 183706, pp. 1-6 (2014).

Horikiri, F., et al., Nondestructive measurement of a homo-epitaxial grown GaN film thickness using FT-IR, Sep. 7, 2017.

* cited by examiner

… …

NITRIDE CRYSTAL SUBSTRATE AND METHOD FOR MANUFACTURING THE SAME

TECHNICAL FIELD

The present invention relates to a nitride crystal substrate and a method for manufacturing the same.

DESCRIPTION OF RELATED ART

Group-III nitride hereinafter sometimes referred to as nitride) is widely used as a material for constituting a semiconductor device such as a light emitting device and an electronic device. As a substrate for growing a nitride semiconductor layer constituting the semiconductor device, a nitride crystal substrate is preferably used. For example, in growing a nitride semiconductor on a nitride crystal substrate, a step of heating the substrate is performed (for example, see patent document 1).

Patent document 1: Japanese Patent Laid-Open Publication No. 2015-185576

As will be described later in detail, an absorption coefficient of the nitride crystal substrate in an infrared region is an important physical property value that affects, for example, the heating characteristics of the substrate, or, affects, for example, a shape of a reflection spectrum of the substrate measured by a Fourier Transform Infrared Spectroscopy (FTIR) method. However, in a conventional art, the absorption coefficient of the nitride crystal substrate in the infrared region cannot be well controlled due to, for example, dislocation scattering.

An object of the present invention is to provide a nitride crystal substrate, constituted by group-III nitride crystal, wherein an absorption coefficient in an infrared region is well controlled, and therefore a quality of crystal constituting the substrate can be properly inspected based on a reflection spectrum measured by irradiating the substrate with infrared light.

According to an aspect of the present invention, there is provided a nitride crystal substrate constituted by group-III nitride crystal, containing n-type impurities, with an absorption coefficient $\alpha$ being approximately expressed by equation (1) by a least squares method in a wavelength range of at least 1 µm or more and 3.3 µm or less.

$$\alpha = N_e K \lambda^a \quad (1)$$

(where $1.5 \times 10^{-19} \leq K \leq 6.0 \times 10^{-19}$, a=3), here, a wavelength is $\lambda$ (µm), an absorption coefficient of the nitride crystal substrate at 27° C. is $\alpha$ (cm$^{-1}$), a carrier concentration in the nitride crystal substrate is Ne (cm$^{-3}$), and K and a are constants, wherein an error of an actually measured absorption coefficient with respect to the absorption coefficient $\alpha$ obtained from equation (1) at a wavelength of 2 µm is within ±0.1α, and in a reflection spectrum measured by irradiating the nitride crystal substrate with infrared light, there is no peak with a peak top within a wavenumber range of 1,200 cm$^{-1}$ or more and 1,500 cm$^{-1}$ or less.

According to another aspect of the present invention, there is provided a nitride crystal substrate constituted by group-HI nitride crystal, containing n-type impurities, with an absorption coefficient $\alpha$ being approximately expressed by equation (1) by a least squares method in a wavelength range of at least 1 µm or more and 3.3 µm or less.

$$\alpha = N_e K \lambda^a \quad (1)$$

(where $1.5 \times 10^{-19} \leq K \leq 6.0 \times 10^{-19}$, a=3)

here, a wavelength is $\lambda$ (1), an absorption coefficient of the nitride crystal substrate at 27° C. is $\alpha$ (cm$^{-1}$), a carrier concentration in the nitride crystal substrate is $N_e$ (cm$^{-3}$), and K and a are constants, wherein an error of an actually measured absorption coefficient with respect to the absorption coefficient $\alpha$ obtained from equation (1) at a wavelength of 2 µm is within ±0.1α, and in a reflection spectrum measured by irradiating the nitride crystal substrate with infrared light, there is a peak with a peak top within a wavenumber range of 1,200 cm$^{-1}$ or more and 1,500 cm$^{-1}$ or less, and a peak height which is a difference between an intensity reflectance of a peak top of the peak and an intensity reflectance of a baseline of the reflection spectrum is 35% or less.

According to another aspect of the present invention, there is provided a method for manufacturing a nitride crystal substrate, including:

preparing a nitride crystal substrate constituted by group-III nitride crystal, containing n-type impurities, with an absorption coefficient $\alpha$ being approximately expressed by equation (1) by a least squares method in a wavelength range of at least 1 µm or more and 3.3 µm or less.

$$\alpha = N_e K \lambda^a \quad (1)$$

(where $1.5 \times 10^{-19} \leq K \leq 6.0 \times 10^{-19}$, a=3)

here, a wavelength is $\lambda$ (µm), an absorption coefficient of the nitride crystal substrate at 27° C. is $\alpha$ (cm$^{-1}$), a carrier concentration in the nitride crystal substrate is $N_e$ (cm$^{-3}$), and K and a are constants, wherein an error of an actually measured absorption coefficient is within +0.1α with respect to the absorption coefficient $\alpha$ obtained from equation (1) at a wavelength of 2 µm, and measuring a reflection spectrum by irradiating the nitride crystal substrate with infrared light, and inspecting whether there is a peak with a peak top within a wavenumber range of 1,200 cm$^{-1}$ or more and 1,500 cm$^{-1}$ or less.

There is provided a nitride crystal substrate which is constituted by group-III nitride crystal, wherein an absorption coefficient in an infrared region is well controlled, and therefore a quality of crystal constituting the substrate can be properly inspected based on a reflection spectrum measured by irradiating the substrate with infrared light.

BRIEF DESCRIPTION OF THE DRAWINGS

FIG. 6A and FIG. 6B are explanatory views showing specific examples of calculation results for refractive index n and extinction coefficient k according to a Lorentz-Drudet model, wherein FIG. 6A is a view showing a calculation result when the carrier concentration is $7 \times 10^{15}$ cm$^{-3}$ and FIG. 6B is a view showing a calculation result when the carrier concentration is $2 \times 10^{18}$ cm$^{-3}$.

DETAILED DESCRIPTION OF THE INVENTION

An Embodiment of the Present Invention

Figure 1A:
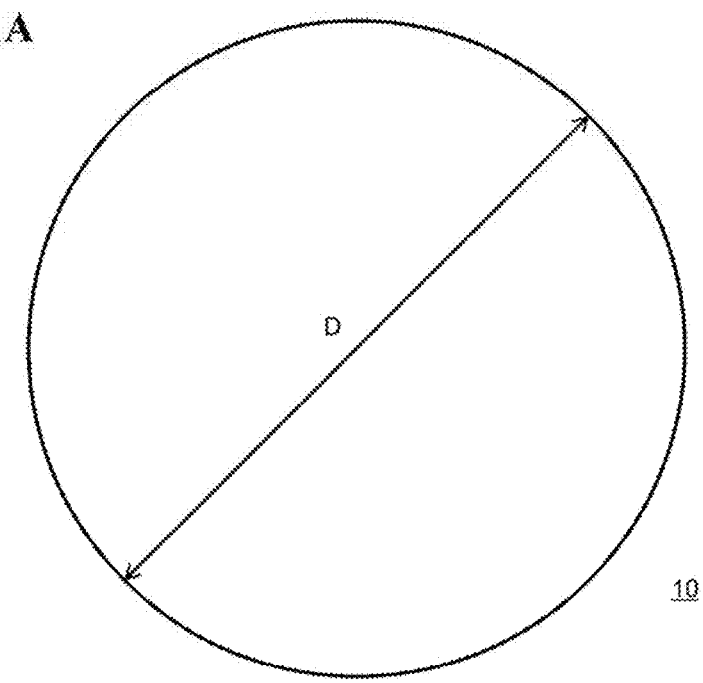
FIG. 1A is a schematic plan view showing a nitride crystal substrate 10 according to an embodiment of the present invention.
Figure 1B:
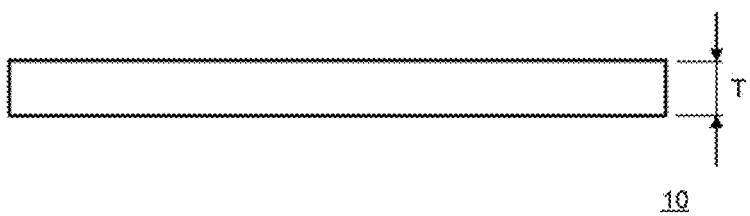
FIG. 1B is a schematic cross-sectional view showing the nitride crystal substrate 10 according to an embodiment of the present invention.

An embodiment of the present invention will be described hereafter, with reference to the drawings.
(1) Nitride Crystal Substrate A nitride crystal substrate 10 (hereinafter also referred to as a substrate 10) according to the present embodiment will be described with reference to FIGS. 1A and 1B. FIG. 1A is a schematic plan view showing the nitride crystal substrate 10, and FIG. 1B is a schematic cross-sectional view showing the nitride crystal substrate 10.

In the following, a main surface of a substrate or the like may be referred to as mainly an upper main surface of the substrate or the like, and may also be referred to as a surface of the substrate or the like. A back surface of the substrate or the like may be referred to as mainly a lower main surface of the substrate or the like.

The substrate 10 is constituted as a disk-like substrate used when manufacturing a semiconductor laminate or a semiconductor device or the like. The substrate 10 is constituted by a group-Ill nitride single crystal, and in the present embodiment, is constituted by, for example, a single crystal of gallium nitride (GaN).

A plane orientation of the main surface of the substrate 10 is, for example, a (0001) plane (+c plane, Ga polar plane). However, for example, it may be 000-1 plane (−c plane, N-polar plane). The GaN crystal constituting the substrate 10 may have a predetermined off-angle with respect to the main surface of the substrate 10. The off-angle refers to the angle between a normal direction of the main surface of the substrate 10 and a main axis (c-axis) of the GaN crystal constituting the substrate 10. Specifically, the off-angle of the substrate 10 is, for example, 0° or more and 1.2° or less. It is also conceivable that the angle is larger than these angles and can be 2° or more and 4° or less. Further, for example, a so-called double off having the off-angle in each of a-direction and m-direction may be acceptable.

Further, a dislocation density on the main surface of the substrate 10 is, for example, $5 \times 10^6$/cm$^2$ or less. If the dislocation density on the main surface of the substrate 10 is more than $5 \times 10^6$/cm$^2$, a local breakdown voltage may be reduced in the semiconductor layer formed on the substrate 10. In contrast, according to the present embodiment, since the dislocation density on the main surface of the substrate 10 is $5 \times 10^6$/cm$^2$ or less, reduction of the local breakdown voltage can be suppressed in the semiconductor layer formed on the substrate 10.

The main surface of the substrate 10 is an epi ready surface, and a surface roughness (arithmetic mean roughness Ra) of the main surface of the substrate 10 is, for example, 10 nm or less, preferably 5 nm or less.

Further, although a diameter D of the substrate 10 is not particularly limited, the diameter D is 25 mm or more. When the diameter D of the substrate 10 is less than 25 mm, productivity at the time of manufacturing a semiconductor device using the substrate 10 is likely to be reduced. Therefore, the diameter D of the substrate 10 is preferably 25 mm or more. Further, a thickness T of the substrate 10 is, for example, 150 μm or more and 2 mm or less. If the thickness T of the substrate 10 is less than 150 μm, a mechanical strength of the substrate 10 may be reduced, which may make it difficult to maintain a freestanding state. Therefore, the thickness T of the substrate 10 is preferably 150 μm or more. Here, for example, the diameter D of the substrate 10 is 2 inches, and the thickness T of the substrate 10 is 400 μm.

Further, the substrate 10 contains, for example, n-type impurities (donor). Examples of the n-type impurities contained in the substrate 10 include silicon (Si) and germanium (Ge). Further, examples of the n-type impurities, are oxygen (O), O and Si, O and Ge, O, Si and Ge, etc., in addition to Si and Ge. Since the substrate 10 is doped with the n-type impurities, free electrons having a predetermined concentration are generated in the substrate 10.

As will be described in detail below, the substrate 10 has an infrared absorption coefficient that satisfies a predetermined requirement. Thereby, the substrate 10 can be favorably heated when the semiconductor layer is grown on the substrate 10 or the like. Further, thereby a reflection spectrum measured by the reflection Fourier transform infrared spectroscopy (FTIR) method for the substrate 10 can be acquired with a shape that almost matches the reflection spectrum obtained from a theoretical formula, and therefore the quality of the GaN crystal that constitutes the substrate 10 can be properly inspected using the FTIR method.

(Regarding Absorption Coefficient Etc.)

In the present embodiment, the substrate 10 satisfies predetermined requirements for the absorption coefficient in an infrared region. Details will be described hereafter.

When manufacturing a nitride semiconductor laminate or when manufacturing a semiconductor device using the nitride semiconductor laminate, for example, a step of heating the substrate 10 is performed, such as a step of epitaxially growing a semiconductor layer on the substrate 10, a step of activating impurities in the semiconductor layer, and the like. For example, when the substrate 10 is heated by irradiating the substrate 10 with infrared light, it is important to set a heating condition based on the absorption coefficient of the substrate 10.

Figure 2:
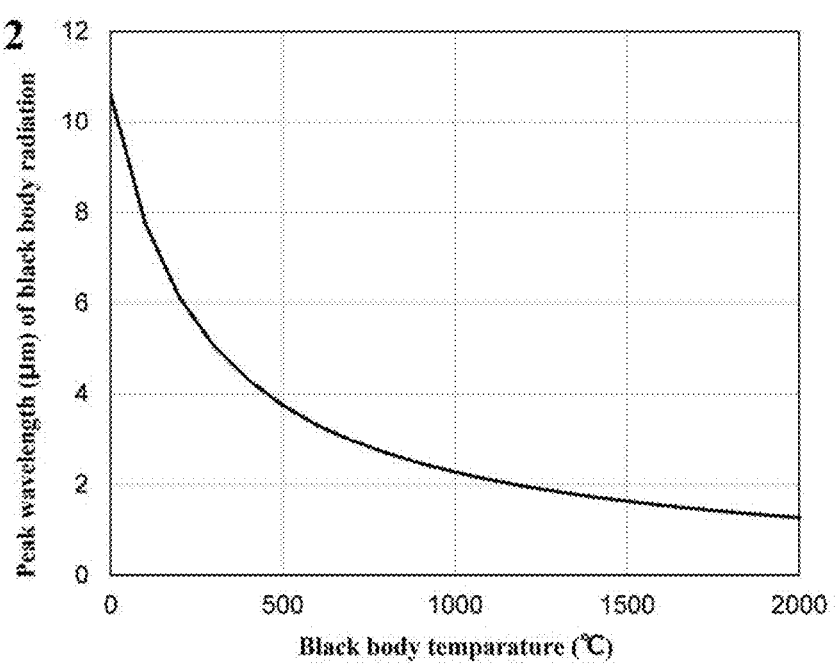
FIG. 2 is a view showing a Wien's displacement rule.

Here, FIG. 2 is a view showing a Wien's displacement rule. In FIG. 2, the horizontal axis indicates a black body temperature (° C.), and the vertical axis indicates a peak wavelength (μm) of black body radiation. According to Vienna's displacement law shown in FIG. 2, the peak wavelength of the black body radiation is inversely proportional to the black body temperature. The peak wavelength and the temperature have a relationship of $\lambda=2,896/(T+273)$, Here, the peak wavelength is $\lambda$ (μm) and the temperature is T (° C.). If radiation from a predetermined heating source in the step of heating the substrate 10 is assumed to be the black body radiation, the substrate 10 is irradiated with an infrared ray having a peak wavelength corresponding to the heating temperature from the heating source. For example, when the temperature is about 1,200° C., the peak wavelength $\lambda$ of the infrared light is 2 μm, and when the temperature is about 600° C., the peak wavelength $\lambda$ of the infrared light is 3.3 μm.

When the substrate 10 is irradiated with the infrared light having such a wavelength, free electron absorption (free carrier absorption) occurs in the substrate 10. Thus, the substrate 10 is heated.

Therefore, in the present embodiment, the absorption coefficient of the substrate 10 in the infrared region satisfies the following predetermined requirements based on the free carrier absorption of the substrate 10.

Figure 3:
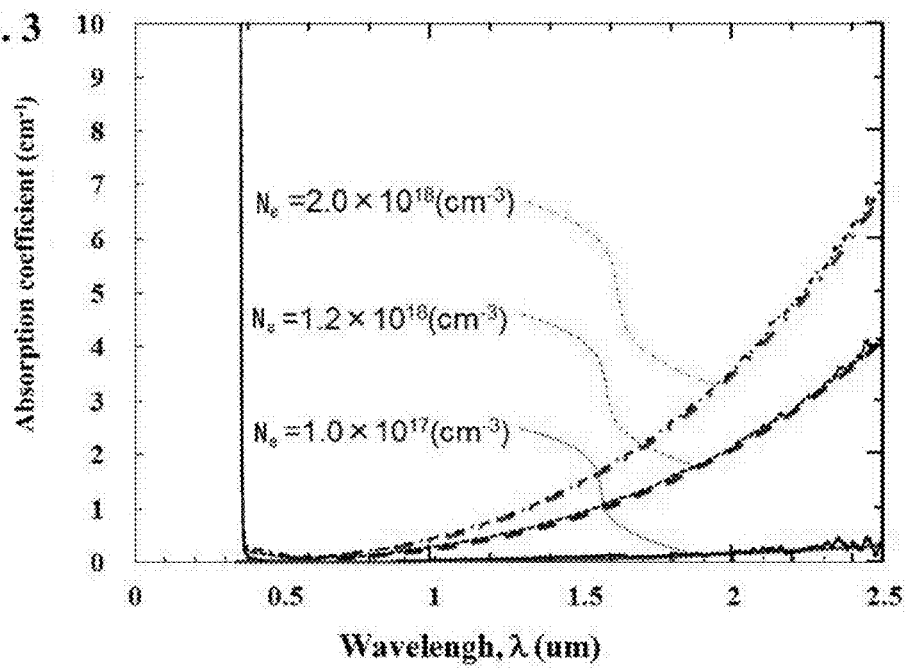
FIG. 3 is a view showing free electron concentration dependence of an absorption coefficient measured at room temperature (27° C.) in GaN crystal manufactured by a manufacturing method according to an embodiment of the present invention.

FIG. 3 is a view showing free electron concentration dependence of an absorption coefficient measured at room temperature (27° C.) in GaN crystal manufactured by a manufacturing method according to an embodiment of the present invention. FIG. 3 also shows the measurement results of a substrate constituted by a GaN crystal manufactured by Si doping by a manufacturing method described later. In FIG. 3, the horizontal axis indicates a wavelength (nm), and the vertical axis indicates an absorption coefficient $\alpha$ (cm$^{-1}$) of the GaN crystal. Further, as shown in FIG. 3, in the GaN crystal manufactured by a manufacturing method described later, the absorption coefficient $\alpha$ in the GaN crystal tends to increase (monotonously increases) toward a long wavelength, due to free carrier absorption in a wavelength range of at least 1 m or more and 3.3 μm or less. Further, the free carrier absorption tends to increase in GaN crystal as the free electron concentration $N_e$ in the GaN crystal increases.

Since the substrate 10 of the present embodiment is constituted by GaN crystal manufactured by the manufacturing method described later, the substrate 10 is in a state of having small crystal distortion, and hardly containing impurities other than oxygen (O) and n-type impurities (for example, impurities, etc., for compensating n-type impurities). Thereby, the free electron concentration dependency of the absorption coefficient like the above FIG. 3 is shown. As a result, in the substrate 10 of the present embodiment, the absorption coefficient in the infrared region can be approximately expressed as a function of the concentration of free carriers and the wavelength as follows.

Specifically, in the substrate 10 of the present embodiment, the absorption coefficient $\alpha$ in the wavelength range of at least 1 μm or more and 3.3 μm or less (preferably 1 μm or more and 2.5 μm or less) is approximately expressed by equation (1):

$$\alpha = N_e K \lambda^a \qquad (1)$$

(wherein, $1.5\times10^{-19} \leq K \leq 6.0\times10^{-19}$, a=3), here, the wavelength is $\lambda$ (μm), the absorption coefficient of the substrate 10 at 27° C. is $\alpha$ (cm$^{-1}$), the free electron concentration in the substrate 10 is $N_e$ (cm$^{-3}$), and K and a are constants.

"The absorption coefficient $\alpha$ is approximately expressed by equation (1)" means that the absorption coefficient $\alpha$ is approximately expressed by equation (1) by a least square method. That is, the above definition includes not only a case where the absorption coefficient completely matches equation (1) (i.e., equation (1) is satisfied) but also a case where equation (1) is satisfied within a predetermined error range. The predetermined error is, for example, within $\pm 0.1\alpha$, preferably within $\pm 0.01\alpha$ at a wavelength of 2 μm.

The absorption coefficient $\alpha$ in the above wavelength range may be considered to satisfy formula (1').

$$1.5\times 10^{-19} N_e \lambda^3 \leq \alpha \leq 6.0\times 10^{-19} N_e \lambda^3 \qquad (1')$$

Further, among the substrates 10 which satisfy the above-described definition, particularly, in a substrate of very high crystal purity (that is, low impurity concentration) where crystal distortion is extremely small, the absorption coefficient $\alpha$ in the above wavelength range is approximately expressed by the formula (1") (which satisfies the formula (1")).

$$\alpha = 2.2\times 10^{-19} N_e \lambda^3. \qquad (1'')$$

Similarly to the above-described definition, the definition that "the absorption coefficient $\alpha$ is approximately expressed by the equation (1')" includes not only a case where the absorption coefficient completely matches the formula (1') (i.e., the formula (1') is satisfied) but also a case where the formula (1') is satisfied within a predetermined error range. The predetermined error is, for example, within $\pm 0.1\alpha$, preferably within $\pm 0.01\alpha$ at a wavelength of 2 μm.

In the above-described FIG. 3, actual measurement values of the absorption coefficient $\alpha$ in the GaN crystal manufactured by the manufacturing method described later are indicated by a thin line. Specifically, the measurement value of the absorption coefficient $\alpha$ is indicated by a thin solid line when the free electron concentration $N_e$ is $1.0\times10^{17}$ cm$^{-3}$, the measurement value of the absorption coefficient $\alpha$ is indicated by a thin dotted line when the free electron concentration $N_e$ is $1.2\times10^{18}$ cm$^{-3}$, and the measurement value of the absorption coefficient $\alpha$ is indicated by a thin one dot chain line when the free electron concentration $N_e$ is $2.0\times10^{18}$ cm$^{-3}$. On the other hand, in the above-described FIG. 3, the function of the above equation (1) is indicated by a thick line. Specifically, the function of equation (1) is indicated by a thick dotted line when the free electron concentration $N_e$ is $1.2\times10^{18}$ cm$^{-3}$, and the function of equation (1) is indicated by a thick one dot chain line when the free electron concentration $N_e$ is $2.0\times10^{18}$ cm$^{-3}$. As shown in FIG. 3, the measured value of the absorption coefficient $\alpha$ in the GaN crystal manufactured by the below-described manufacturing method can be fitted with high accuracy by the function of equation (1), In the case of FIG. 3 (in the case of Si doping), the absorption coefficient $\alpha$ is accurately approximately expressed by equation (1) when $K=2.2\times10^{-19}$.

Thus, since the absorption coefficient $\alpha$ of the substrate 10 is approximately expressed by equation (1), the absorption coefficient $\alpha$ can be designed with high accuracy based on the concentration $N_e$ of the free electrons in the substrate 10. Namely, the variation of the absorption coefficient $\alpha$ of the substrate 10 with respect to the free electron concentration $N_e$ in the substrate 10 can be suppressed. The suppression of the variation of the absorption coefficient $\alpha$ means that the variation of a below-described extinction coefficient k is suppressed ($\alpha=4\pi k/\lambda$). Accordingly, since the substrate 10 of the present embodiment is used, a reflection spectrum measured by the reflection type FTIR method for the main surface of the substrate 10 can be excellently matched with the reflection spectrum obtained from a theoretical formula that includes the extinction coefficient k.

Further, in the present embodiment, for example, the absorption coefficient $\alpha$ of the substrate 10 satisfies equation (2) in a wavelength range of at least 1 μm or more and 3.3 μm or less, $$0.15\lambda^3 \le \alpha \le 6\lambda^3 \quad (2)$$

In the case of $\alpha<0.15\lambda^3$, infrared rays cannot be sufficiently absorbed by the substrate 10, and heating of the substrate 10 may become unstable. In contrast, by satisfying $0.15\lambda^3\le\alpha$, the infrared rays can be sufficiently absorbed by the substrate 10, and the substrate 10 can be stably heated. On the other hand, in the case of $6\lambda^3<\alpha$, this case corresponds to a case where the concentration of the n-type impurity in the substrate 10 is more than a predetermined value (more than $1\times10^{19}$ at·cm$^{-3}$) as described later, and crystallinity of the substrate 10 may be reduced. In contrast, in the case of $\alpha\le6\lambda^3$, this case corresponds to a case where the concentration of the n-type impurity in the substrate 10 is a predetermined value or less, and good crystallinity of the substrate 10 can be secured.

The absorption coefficient $\alpha$ of the substrate 10 preferably satisfies formula (2') or formula (2"), $$0.15\lambda^3 \le \alpha \le 3\lambda^3 \quad (2')$$

$$0.15\lambda^3 \le \alpha \le 1.2\lambda^3 \quad (2'')$$

Thereby, better crystallinity of the substrate 10 can be secured while enabling stable heating of the substrate 10, Further, in the present embodiment, for example, $\Delta\alpha$ (cm$^{-1}$) satisfies equation (3) in a wavelength range of 1 μm or more and 3.3 μm or less, $$\Delta\alpha \le 1.0 \quad (3)$$

here, a difference between a maximum value and a minimum value of the absorption coefficient $\alpha$ in a main surface of the substrate 10 is $\Delta\alpha$ (the difference between the maximum value and the minimum value, hereinafter also referred to as "in-plane absorption coefficient difference of the substrate 10").

In the case of $\Delta\alpha>1.0$, there is a possibility that a heating efficiency by irradiation of the infrared rays becomes non-uniform within the main surface of the substrate 10. In contrast, by satisfying $\Delta\alpha\le1.0$, the heating efficiency by irradiation of the infrared rays can be uniform in the main surface of the substrate 10.

It is preferable that $\Delta\alpha$ satisfy formula (3').

$$\Delta\alpha \le 0.5 \quad (3')$$

By satisfying $\Delta\alpha\le0.5$, the heating efficiency by irradiation of the infrared rays can be stabilized uniformly in the main surface of the substrate 10.

The definitions of formulas (2) and (3) regarding the absorption coefficient $\alpha$ and $\Delta\alpha$ can be replaced, for example, with the definitions at a wavelength of 2 μm.

Namely, in the present embodiment, for example, the absorption coefficient at the wavelength of 2 μm in the substrate 10 is 1.2 cm$^{-1}$ or more and 48 cm$^{-1}$ or less. The absorption coefficient at the wavelength of 2 μm in the substrate 10 is preferably 1.2 cm$^{-1}$ or more and 24 cm$^{-1}$ or less, and more preferably 1.2 cm$^{-1}$ or more and 9.6 cm$^{-1}$ or less.

Further, in the present embodiment, for example, the difference between the maximum value and the minimum value of the absorption coefficient at the wavelength of 2 μm in the main surface of the substrate 10 is within 1.0 cm$^{-1}$, preferably within 0.5 cm$^{-1}$.

Although an upper limit value of the in-plane absorption coefficient difference of the substrate 10 has been described, the smaller the lower limit value of the in-plane absorption coefficient difference of the substrate 10, the better. Therefore, zero is preferable. Even if the in-plane absorption coefficient difference of the substrate 10 is 0.01 cm$^{-1}$, the effects of the present embodiment can be sufficiently obtained.

Here, a requirement for the absorption coefficient of the substrate 10 was defined at the wavelength of 2 μm, which corresponds to the infrared peak wavelength when the temperature is approximately 1200° C. However, the effect of satisfying the above requirements for the absorption coefficient of the substrate 10 is not limited to a case of setting the temperature to about 1,200° C. This is because the spectrum of the infrared rays emitted from the heating source has a predetermined wavelength width in accordance with Stefan-Boltzmann's law, and has a component with a wavelength of 2 μm even if the temperature is other than 1,200° C. Therefore, if the absorption coefficient of the substrate 10 satisfies the above requirement at a wavelength of 2 μm corresponding to the temperature of 1,200° C., the absorption coefficient of the substrate 10 and the difference between the maximum value and the minimum value of the absorption coefficient in the main surface of the substrate 10 fall within a predetermined range, even at wavelengths where the temperature corresponds to other than 1,200.

Thereby, the substrate 10 can be stably heated, and the heating efficiency for the substrate 10 can be made uniform in the main surface, even if the temperature is not 1,200° C.

The above-described FIG. 3 is the result of measuring the absorption coefficient of the GaN crystal at room temperature (27° C.). Therefore, when considering the absorption coefficient of the substrate 10 under predetermined temperature conditions in heating the substrate 10, it is necessary to consider how does the free carrier absorption of GaN crystal under a predetermined temperature condition change relative to the free carrier absorption of GaN crystal under a temperature condition of room temperature.

Figure 4:
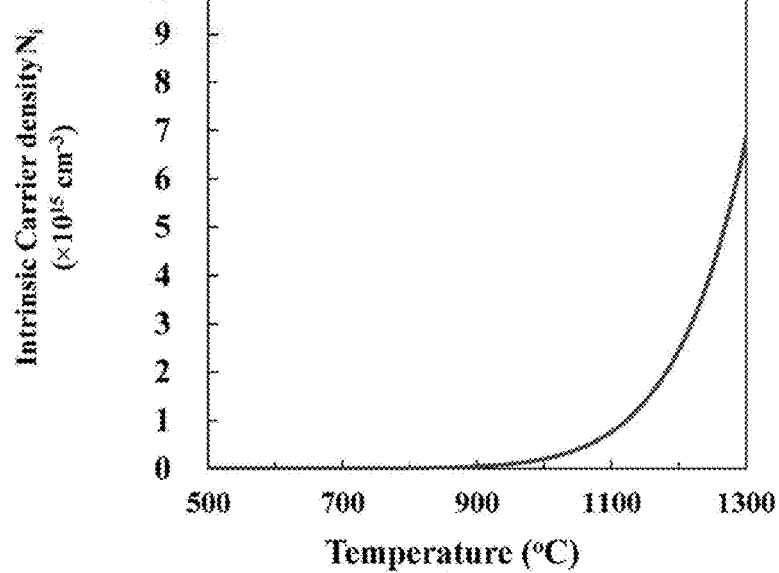
FIG. 4 is a graph showing an intrinsic carrier concentration with respect to a temperature of GaN crystal.

FIG. 4 is a view showing an intrinsic carrier concentration with respect to a temperature of GaN crystal. As shown in FIG. 4, in the GaN crystal constituting the substrate 10, the higher the temperature, the higher the concentration of the intrinsic carrier concentration Ni that is thermally excited between bands (between the valence band and the conduction band). However, even if the temperature of the GaN crystal is around 1,300° C., the concentration of the intrinsic carrier concentration Ni that is thermally excited between the bands of the GaN crystal is less than $7 \times 10^{15}$ cm$^{-3}$, and is sufficiently lower than the concentration of free carriers (e.g., $1 \times 10^{17}$ cm$^{-3}$) generated in the GaN crystal by doping with n-type impurities. Namely, it can be said that the concentration of free carriers in the GaN crystal falls in a so-called extrinsic region in which the concentration of free carriers is determined by doping with n-type impurities under a temperature condition where the temperature of the GaN crystal is less than 1,300° C.

The temperature conditions in the manufacturing step of the semiconductor laminate or the semiconductor device are, for example, room temperature (27° C.) or more and 1.250° C. or less. Therefore, the concentration of intrinsic carriers thermally excited between the bands of the substrate 10 is lower (for example, 1/10 times or less) than the concentration of free electrons generated in the substrate 10 by the doping of n-type impurities under the temperature condition of room temperature, Therefore it can be considered that the concentration of free carriers of the substrate 10 under the predetermined temperature condition in the step of heating the substrate 10 is approximately equal to the concentration of free carriers of the substrate 10 under the room temperature condition, and it can be considered that the free carrier absorption under a predetermined temperature condition is approximately equal to the free carrier absorption at room temperature. Namely, as described above, when the absorption coefficient of the substrate 10 in the infrared region satisfies the predetermined requirements at room temperature, it can be considered that the absorption coefficient of the substrate 10 in the infrared region substantially maintains the predetermined requirements described above under a predetermined temperature condition as well.

Further, in the substrate 10 according to the present embodiment, the absorption coefficient α in the wavelength range of at least 1 μm or more and 3.3 μm or less is approximately expressed by equation (1). Therefore, the absorption coefficient α of the substrate 10 has a substantially proportional relationship to the free electron concentration $N_e$ at a predetermined wavelength λ.

Figure 5A:
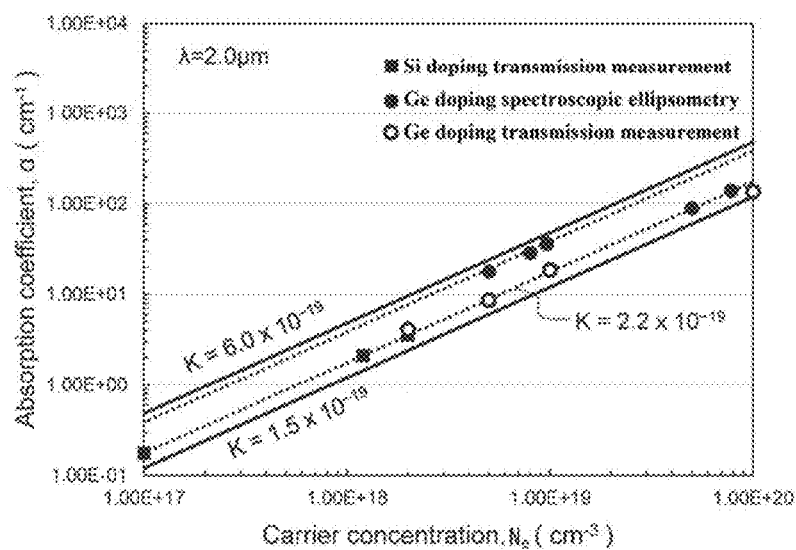
FIG. 5A is a view showing a relationship between an absorption coefficient at a wavelength of 2 μm and the free electron concentration in the GaN crystal manufactured by the manufacturing method according to an embodiment of the present invention.

FIG. 5A is a view showing a relationship between an absorption coefficient at a wavelength of 2 μm and the free electron concentration in the GaN crystal manufactured by the manufacturing method according to an embodiment of the present invention. In FIG. 5A, a lower solid line (α=1.2× $10^{-18}$ n) is a function obtained by substituting K=1.5×$10^{-19}$ and λ=2.0 into equation (1), and an upper solid line (α=4.8× $10^{-18}$ n) is a function obtained by substituting K=6.0×$10^{-19}$ and λ=2.0 into equation (1). FIG. 5A also shows not only GaN crystal doped with Si, but also GaN crystal doped with Ge. FIG. 5A also shows the result of measuring the absorption coefficient by transmission measurement and the result of measuring the absorption coefficient by spectroscopic ellipsometry. As shown in FIG. 5A, when the wavelength λ is 2.0 μm, the absorption coefficient α of the GaN crystal manufactured by the below-described manufacturing method has a relationship substantially proportional to the free electron concentration $N_e$. Further, the measured value of the absorption coefficient α in the GaN crystal manufactured by the below-described manufacturing method can be fitted with high accuracy in many cases by the function of equation (1), within a range of $1.5 \times 10^{-19} \le K \le 6.0 \times 10^{-19}$. The GaN crystal manufactured by the below-described manufacturing method has high purity (that is, low impurity concentration) and good thermal and electrical properties. Therefore, the measured value of the absorption coefficient α can be fitted with high accuracy in many cases by the function of equation (1) when K=2.2×$10^{-19}$, ie, by α=1.8× $10^{-18}$ n.

In the present embodiment, the free electron concentration $N_e$ in the substrate 10 satisfies the following predetermined requirements, based on the fact that the absorption coefficient α of the substrate 10 described above is proportional to the free electron concentration $N_e$.

In the present embodiment, for example, the free electron concentration $N_e$ in the substrate 10 is $1.0 \times 10^{18}$ cm$^{-3}$ or more and $1.0 \times 10^{19}$ cm$^{-3}$ or less. Thereby, from the equation (1), the absorption coefficient of the substrate 10 at a wavelength of 2 μm can be 1.2 cm$^{-1}$ or more and 48 cm$^{-1}$ or less. The free electron concentration $N_e$ in the substrate 10 is preferably $1.0 \times 10^{18}$ cm$^{-3}$ or more and $5.0 \times 10^{18}$ cm$^{-3}$ or less, and is more preferably $1.0 \times 10^{18}$ cm$^{-3}$ or more and $2.0 \times 10^{18}$ cm$^{-3}$ or less. Thereby, the absorption coefficient at a wavelength of 2 μm in the substrate 10 can be preferably 1.2 cm$^{-1}$ or more and 24 cm$^{-1}$ or less, and more preferably 1.2 cm$^{-1}$ or more and 9.6 cm$^{-1}$ or less.

Further, as described above, equation (4) can be obtained by differentiating equation (1):

$$\Delta \alpha = 8K\Delta N_e \quad (4)$$

wherein the difference between the maximum value and the minimum value of the absorption coefficient α in the main surface of the substrate 10 is Δα, the difference between the maximum value and the minimum value of the free electron concentration $N_e$ in the main surface of the substrate 10 is $\Delta N_e$, and the wavelength λ is 2.0 μm.

In the present embodiment, for example, the difference $\Delta N_e$ between the maximum value and the minimum value of the free electron concentration $N_e$ in the main surface of the substrate 10 is within $8.3 \times 10^{17}$ cm$^{-3}$ m, and preferably within 4.2×10 17 cm$^{-3}$, Thereby, from the equation (4), the difference Δα between the maximum value and the minimum value of the absorption coefficient at a wavelength of 2 μm can be within 1.0 cm$^{-1}$, preferably within 0.5 cm$^{-1}$.

The upper limit value of $\Delta N_e$ has been described, and a lower limit value of $\Delta N_e$ is preferably zero, because the smaller the better. Even if $\Delta N_e$ is $8.3 \times 10^{15}$ cm$^{-3}$, the effects of the present embodiment can be sufficiently obtained.

In the present embodiment, the free electron concentration $N_e$ in the substrate 10 is equal to the concentration of n-type impurities in the substrate 10, and the concentration of n-type impurities in the substrate 10 satisfies the following predetermined requirements.

In the present embodiment, for example, the concentration of the n-type impurities in the substrate 10 is $1.0\times10^{18}$ at·cm$^{-3}$ or more and $1.0\times10^{19}$ at·cm$^3$ or less. Thereby, the free electron concentration $N_e$ in the substrate 10 can be $1.0\times10^{18}$ cm$^{-3}$ or more and $1.0\times10^{19}$ cm$^{-3}$ or less. The concentration of the n-type impurities in the substrate 10 is preferably $1.0\times10^{18}$ at·cm$^{-3}$ or more and $5.0\times10^{18}$ at·cm$^{-3}$ or less, and more preferably $1.0\times10^{18}$ at·cm$^{-3}$ or more and $2.0\times10^{18}$ at·cm$^{-3}$ or less. Thereby, the free electron concentration $N_e$ in the substrate 10 can be preferably $1.0\times10^{18}$ cm$^{-3}$ or more and $5.0\times10^{18}$ cm$^{-3}$ or less, and more preferably $1.0\times10^{18}$ cm$^{-3}$ or more and $2.0\times10^{18}$ cm$^3$ or less.

Further, in the present embodiment, for example, the difference between the maximum value and the minimum value of the concentration of the n-type impurities in the main surface of the substrate 10 (hereinafter, also referred to as in-plane concentration difference of the n-type impurities) is within $8.3\times10^{17}$ at·cm$^{-3}$, preferably within $4.2\times10^{17}$ at·cm$^{-3}$. Thereby, the difference $\Delta N_e$ between the maximum value and the minimum value of the free electron concentration $N_e$ in the main surface of the substrate 10 can be equal to the in-plane concentration difference of the n-type impurities, and can be $8.3\times10^{17}$ cm$^{-3}$ or less, preferably $4.2\times10^{17}$ cm$^{-3}$ or less.

The upper limit value of the in-plane concentration difference of n-type impurities has been described, and a lower limit value of in-plane concentration difference of the n-type impurity is preferably zero, because the smaller the better. Even if the in-plane concentration difference of the n-type impurities is $8.3\times10^{15}$ at·cm$^3$, the effects of the present embodiment can be sufficiently obtained.

Further, in the present embodiment, the concentration of each element in the substrate 10 satisfies the following predetermined requirements.

In the present embodiment, among Si, Ge and O used as n-type impurities, the concentration of O is extremely low, whose control of an amount of addition is relatively difficult, and the concentration of n-type impurities in the substrate 10 is determined by a total concentration of Si and Ge whose control of an amount of addition is relatively easy.

Namely, the concentration of O in the substrate 10 is negligibly low, for example, ¹⁄₁₀ or less relative to a total concentration of Si and Ge in the substrate 10. Specifically, for example, the concentration of 0 in the substrate is less than $1\times10^{17}$ at·cm$^{-3}$, and meanwhile the total concentration of Si and Ge in the substrate 10 is $1\times10^{18}$ at·cm$^{-3}$ or more and $1.0\times10^{19}$ at·cm$^3$ or less. Thereby, the concentration of n-type impurities in the substrate 10 can be controlled by the total concentration of Si and Ge, whose control of an amount of addition is relatively easy. As a result, the free electron concentration $N_e$ in the substrate 10 can be controlled accurately so as to be equal to the total concentration of Si and Ge in the substrate 10, and the difference $\Delta N_e$ between the maximum value and the minimum value of the concentration of free electrons in the main surface of the substrate 10 can be controlled accurately so as to satisfy predetermined requirements.

Further, in the present embodiment, the concentration of impurities other than n-type impurities in the substrate 10 is negligibly low, for example, ¹⁄₁₀ or less relative to the concentration of n-type impurities in the substrate 10 (namely, the total concentration of Si and Ge in the substrate 10). Specifically, for example, the concentration of impurities other than n-type impurities in the substrate 10 is less than $1\times10^{17}$ at·cm$^{-3}$. Thereby, an inhibiting factor for the generation of free electrons from n-type impurities can be reduced. As a result, the free electron concentration $N_e$ in the substrate 10 can be accurately controlled so as to be equal to the concentration of n-type impurities in the substrate 10, and the difference $\Delta N_e$ between the maximum value and the minimum value of the concentration of free electrons in the main surface of the substrate 10 can be controlled so as to satisfy predetermined requirements.

The inventor of the present invention confirms as follows: since a later-described manufacturing method is adopted, the concentration of each element in the substrate 10 can be stably controlled so as to satisfy the above requirements.

According to the manufacturing method described later, it is found that each concentration of O and carbon (C) in the substrate 10 can be reduced to less than $5\times10^{15}$ at·cm$^{-3}$, and further each concentration of iron (Fe), chromium (Cr), boron (B), etc., in the substrate 10 can be reduced to less than $1\times10^{15}$ at·cm$^{-3}$. Further, according to this method, it is found that each concentration of elements other than the above elements can also be reduced to concentrations below the lower limit of detection by secondary ion mass spectrometry (SIMS) measurement.

Further, in the substrate 10 manufactured by a later-described manufacturing method according to the present embodiment, it is estimated that mobility (μ) is higher in the substrate 10 of the present embodiment than that of a conventional substrate, because the absorption coefficient due to free carrier absorption is smaller than that of the conventional substrate, Thereby, even if the concentration of free electrons in the substrate 10 of the present embodiment is equal to the concentration of free electrons in the conventional substrate, resistivity ($\rho=1/eN_e\mu$) of the substrate 10 of the present embodiment is lower than the resistivity of the conventional substrate. Specifically, when the free electron concentration $N_e$ in the substrate 10 is $1.0\times10^{18}$ cm$^{-3}$ or more and $1.0\times10^{19}$ cm$^{-3}$ or less, the resistivity of the substrate 10 is, for example, 2.2 mΩ·cm or more and 17.4 mΩ·cm or less.

(Regarding Derivation, Etc., of a Reflection Spectrum by Theoretical Formula)

A method of obtaining a reflection spectrum of the substrate 10 from a theoretical formula will be described, the substrate 10 being measured by a reflection type FTIR method. Further, a method of obtaining the carrier concentration $N_{IR}$ and the mobility $\mu_{IR}$ of the substrate 10 based on a reflectance of the main surface measured by the reflection type FTIR method will be described. Hereinafter, a reflection spectrum measured by irradiating the substrate 10 with infrared light is referred to as "a measured reflection spectrum", and a reflection spectrum obtained from the theoretical formula is referred to as "a calculated reflection spectrum" in some cases. In order to obtain the calculated reflection spectrum, an optical model that represents a structure of the substrate 10 and a dielectric function model that represents a dielectric function of the substrate 10 are used.

As a dielectric function model used for analysis of an optical model, for example, Lorentz-Drude model is known. In the Lorentz-Drude model, not only free carrier absorption but also the coupling of LO phonons with plasmons is taken into consideration.

Specifically, a dielectric constant (complex dielectric constant) ε in the Lorentz-Drude model is obtained by equation (5).

[Formula 1]

$$\varepsilon = \varepsilon_\infty \left[ \frac{\omega_{LO}^2 - \omega^2 - i\omega\Gamma_{LO}}{\omega_{TO}^2 - \omega^2 - i\omega\Gamma_{TO}} - \frac{\omega_p^2}{\omega(\omega + i\gamma)} \right] \quad (5)$$

Here, $\varepsilon_\infty$ is a high frequency dielectric constant, $\omega_{LO}$, $\omega_{TO}$ and $\omega_p$ are, respectively, LO phonon frequency, TO phonon frequency and plasma frequency, and $\Gamma_{LO}$, $\Gamma_{TO}$ and $\gamma$ are respectively a LO phonon damping constant, a TO phonon damping constant and a free carrier damping constant.

Further, the plasma frequency $\omega_p$ is obtained by equation (6).

[Formula 2]

$$\omega_p^2 = \frac{N_c e^2}{\varepsilon_\infty m^*} \quad (6)$$

Here, Nc, e, m* are carrier concentration, elementary charge, and effective mass of free carrier, respectively.

Further, free carrier attenuation constant $\gamma$ is obtained by equation (7).

[Formula 3]

$$\gamma = \frac{e}{m^* \mu} \quad (7)$$

Here, $\mu$ is mobility.

Wherein the dielectric constant $\varepsilon$ of the equation (5) is defined as $\varepsilon \equiv \varepsilon_1 + i\varepsilon_2$. Further, complex refractive index N is defined as $N \equiv n - ik$. Here, n is a refractive index and k is an extinction coefficient. Note that k>0.

The refractive index n is obtained by equation (8) using $\varepsilon_1$ and $\varepsilon_2$.

[Formula 4]

$$n^2 = \frac{\varepsilon_1 + \sqrt{\varepsilon_1^2 + \varepsilon_2^2}}{2} \quad (8)$$

Extinction coefficient k is obtained by equation (9) using $\varepsilon_1$ and $\varepsilon_2$.

[Formula 5]

$$k^2 = \frac{-\varepsilon_1 + \sqrt{\varepsilon_1^2 + \varepsilon_2^2}}{2} \quad (9)$$

Figure 6A:
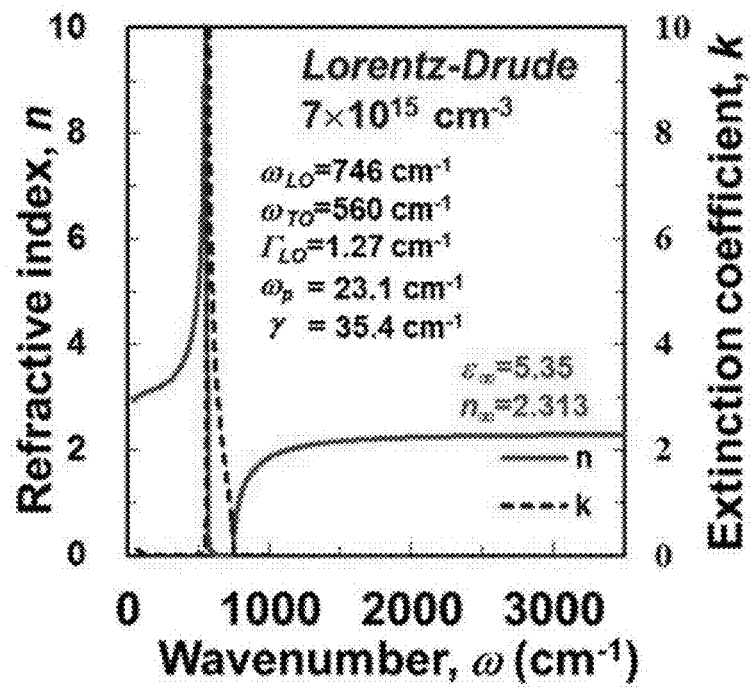
Figure 6B:
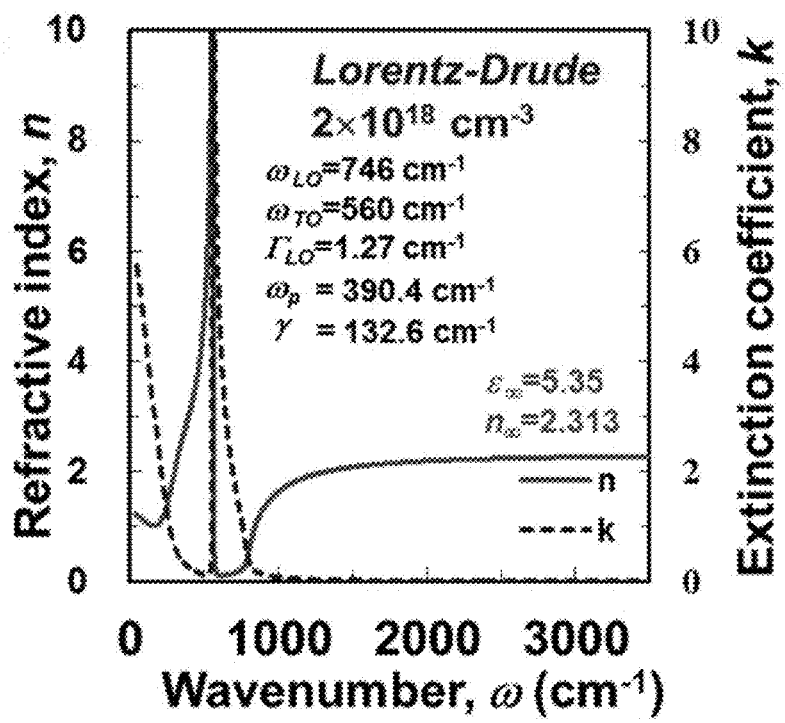

FIG. 6A and FIG. 6B are explanatory views showing specific examples of calculation results for refractive index n and extinction coefficient k according to a Lorentz-Drudet model, wherein FIG. 6A is a view showing a calculation result when the carrier concentration is $7 \times 10^{15}$ cm$^{-3}$ and FIG. 6B is a view showing a calculation result when the carrier concentration is $2 \times 10^{18}$ cm$^{-3}$.

Here, in the GaN crystal, the following equations are satisfied.

$\varepsilon_\infty = 5.35$, $m_e^* = 0.22\, m_0$, $\omega_{LO} = 735$ cm$^{-1}$, $\omega_{TO} = 557$ cm$^{-1}$, $\Gamma_{LO} = 12$ cm$^{-1}$ $\Gamma_{TO} = 6$ cm$^{-1}$, $\gamma = 35.4$ cm$^{-1}$ in FIG. 6A $\gamma = 132.6$ cm$^{-1}$ in FIG. 6B As shown in FIG. 6A and FIG. 6B, refractive index n and extinction coefficient k are different in a near infrared region (600 to 2,500 cm$^{-1}$) and in a far infrared region (0 to 500 cm$^{-1}$), depending on carrier concentration Nc and mobility $\mu$. These differences will be reflected in the reflectance.

Figure 7:
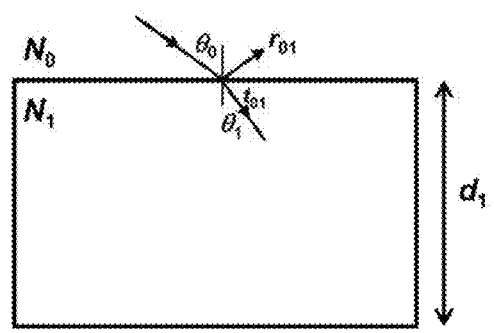
FIG. 7 is a schematic view showing an example of a single-layer optical model.

Next, an optical model of FIG. 7 is considered on the assumption of a reflection on a main surface of the substrate 10. FIG. 7 is a schematic view showing an example of a single-layer optical model. In FIG. 7, medium $N_0$ is the atmosphere or a vacuum, and medium $N_1$ is the substrate 10. Further, $r_{ij}$ is an amplitude reflection coefficient of light incident from the medium $N_i$ toward the medium $N_j$ and reflected from the medium $N_j$ toward the medium Ni.

The reflection of light depends on a complex refractive index of a medium. Further, light is differentiated into p-polarized light and s-polarized light depending on a direction of an electric field when it enters the medium. The p-polarized light and the s-polarized light show different reflections. A plane perpendicular to an interface between media and containing incident light and reflected light is called an "incident plane", and the p-polarized light is a polarization in which the electric field oscillates in the plane of incidence, and the s-polarized light is a polarization in which the electric field oscillates perpendicularly to the plane of incidence.

Amplitude reflection coefficient $r_p$ of the p-polarized light can be obtained by equation (10).

[Formula 6]

$$r_p = \frac{N_{ti}^2 \cos\theta_i - \sqrt{N_{ti}^2 - \sin^2\theta_i}}{N_{ti}^2 \cos\theta_i + \sqrt{N_{ti}^2 - \sin^2\theta_i}}, \quad N_{ti} = N_t/N_i \quad (10)$$

On the other hand, amplitude reflection coefficient $r_s$ of the s-polarized light can be obtained by equation (11),

[Formula 7]

$$r_s = \frac{\cos\theta_i - \sqrt{N_{ti}^2 - \sin^2\theta_i}}{\cos\theta_i + \sqrt{N_{ti}^2 - \sin^2\theta_i}}, \quad N_{ti} = N_t/N_i \quad (11)$$

Here, in equations (10) and (11), $\theta_i$ is an incident angle of light from the medium $N_i$. Further, $N_{ti}$ is a complex refractive index of light incident on medium t from medium i.

Intensity reflectance is obtained by equation (12).

[Formula 8]

$$R = \frac{r_p^2 + r_s^2}{2} = \frac{R_p + R_s}{2} \quad (12)$$

In the case of vertical incidence (θi=0), the intensity reflectance is obtained by equation (13).

[Formula 9]

$$R = R_p(=r_p^2) = R_s(=r_s^2) = \frac{(n-1)^2 + k^2}{(n+1)^2 + k^2} \quad (13)$$

In FIG. 7, intensity reflectance R of the light reflected at the interface between the medium $N_0$ and the medium $N_1$ is obtained by the following procedure. First, ε∞, m*, $\omega_{LO}$, $\omega_{TO}$, $\Gamma_{LO}$ and $\Gamma_{TO}$ in the GaN crystal as medium $N_1$ are substituted into equations (5) to (7), to obtain dielectric constant ε of the medium $N_1$. After obtaining the dielectric constant ε of the medium $N_1$, refractive index n and extinction coefficient k of the medium $N_1$ are obtained by equations (8) and (9). Medium $N_0$ is assumed to be a vacuum, and n and k are set to n=1 and k=0. After obtaining refractive index n and extinction coefficient k, in each of equation (10) and equation (11), i and t are set to i=0 and t=1, and $N_0$ and $N_1$ are substituted into equation (10) and equation (11), to obtain $r_{01,p}$ and $r_{01,s}$. After obtaining $r_{01,p}$ and $r_{01,s}$, $r_{01,p}$ and $r_{01,s}$ are substituted into equation (12). Thereby, intensity reflectance R is obtained. Carrier concentration $N_c$ (free electron concentration $N_e$) and mobility μ in the medium $N_1$ become fitting parameters described later.

Figure 8:
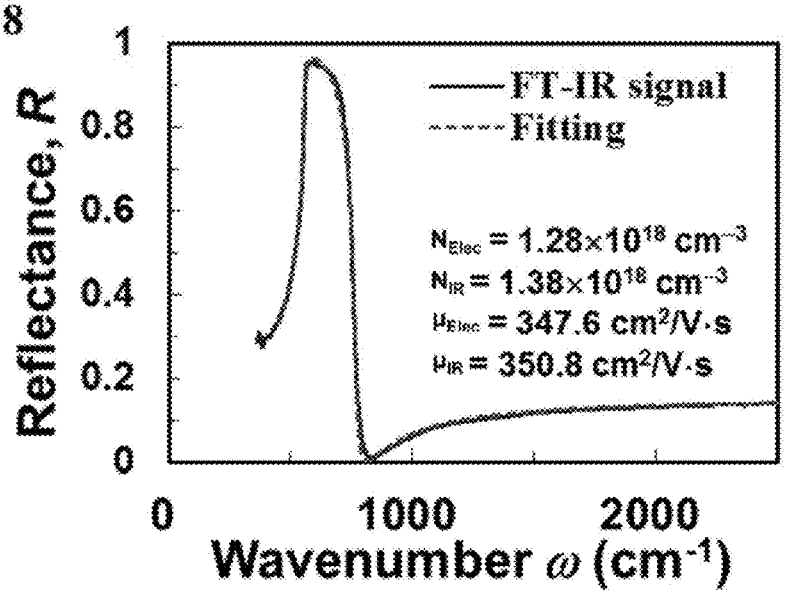
FIG. 8 shows a reflectance spectrum of a main surface of the nitride crystal substrate 10 measured by reflective FTIR method, and a reflectance spectrum of the main surface of the nitride crystal substrate 10 fitted by Lorentz-Drude model, according to an embodiment of the present invention, and shows a case where no point defect-caused peak is observed.

Here, fitting of the reflectance spectrum of the substrate 10 will be described with reference to FIG. 8. FIG. 8 shows a reflectance spectrum of a main surface of the nitride crystal substrate 10 measured by reflective FTIR method (measured reflection spectrum), and a reflectance spectrum of the main surface of the nitride crystal substrate 10 fitted by Lorentz-Drude model (calculated reflection spectrum), according to an embodiment of the present invention. In the measurement of the reflectance spectrum in FIG. 8, θ₀=30°.

As shown in FIG. 8, a measured reflectance spectrum (solid line in the figure) of the main surface of the substrate 10 is obtained by measurement of the reflection type FTIR method. After obtaining the measured reflectance spectrum, intensity reflectance R obtained from the above theoretical formula, that is, the calculated reflection spectrum (broken line in the figure) is fitted to the measured reflectance spectrum, using carrier concentration $N_c$ and mobility μ as fitting parameters in the substrate 10 as medium $N_1$. As a result of the fitting, carrier concentration $N_c$ and mobility μ in the substrate 10 are obtained, at the time of a best match between the measured reflectance spectrum and the calculated reflectance spectrum. Thus, carrier concentration $N_{IR}$ and mobility $\mu_{IR}$ of the substrate 10 are obtained by the reflection type FTIR method.

The present inventor confirms the validity of carrier concentration $N_{IR}$ and mobility $\mu_{IR}$ measured by the reflection type FTIR method, by also performing an electrical measurement. Carrier concentration $N_{Elec}$ and mobility $\mu_{Elec}$ of the substrate 10 by the electrical measurement are obtained by the following method.

Mobility $\mu_{Elec}$ of the substrate 10 is measured by an eddy current method. The resistance of the substrate 10 is measured by a stylus resistance meter. Further, the thickness of the substrate 10 is measured by a micrometer. After obtaining the resistance (sheet resistance) of the substrate 10 and the thickness of the substrate 10, they are converted to resistivity ρ. By substituting mobility $\mu_{Elec}$ and resistivity ρ of the substrate 10 into equation (14), mobility $\mu_{Elec}$ and resistivity ρ being obtained by the above measurements, carrier concentration $N_{Elec}$ of the substrate 10 is obtained.

$$1/\rho = eN_{Elec}\mu_{Elec} \quad (14)$$

The present inventor also confirms that carrier concentration $N_{Elec}$ and mobility $\mu_{Elec}$ of the substrate 10 obtained by the above-described method matches the carrier concentration and the mobility obtained by Hall measurement of Van der Pauw method.

As shown in FIG. 8, since the substrate 10 of the present embodiment is used, the measured reflection spectrum and the calculated reflection spectrum can be approximately matched by fitting. Thereby, as described above, carrier concentration $N_{IR}$ and mobility $\mu_{IR}$ of the substrate 10 can be obtained with high accuracy. Also from this fact, the following advantages can be obtained. If there is some factor on the substrate 10 that causes a deviation from the calculated reflection spectrum, such as a point defect etc., the peak caused by the factor (hereinafter, also referred to as "point defect-caused peak" or simply "peak") can be clearly detected as a deviation from the calculated reflection spectrum in the measured reflection spectrum.

Figure 9:
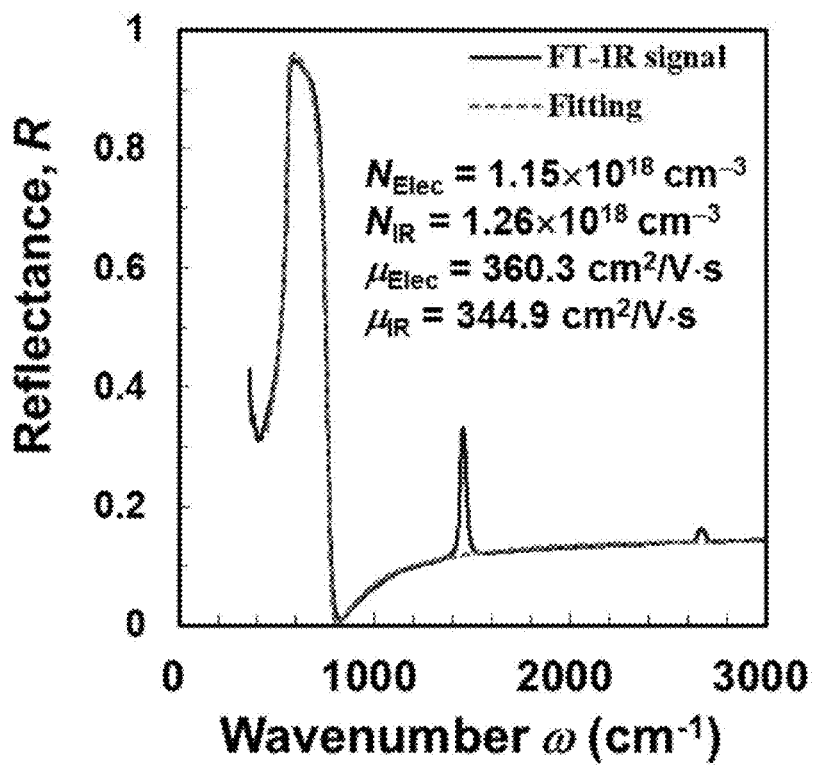
FIG. 9 shows a reflectance spectrum of a main surface of the nitride crystal substrate 10 measured by reflective FTIR method, and a reflectance spectrum of the main surface of the nitride crystal substrate 10 fitted by Lorentz-prude model, according to an embodiment of the present invention, and shows a case where point defect-caused peak is observed.

FIG. 8 shows the measured reflection spectrum in a case where no point defect-caused peak is observed. FIG. 9 shows the measured reflection spectrum in a case where a point defect-caused peak is observed. In FIG. 9 as well, the measured reflection spectrum is shown as a solid line and the calculated reflection spectrum is shown as a broken line. The measured reflection spectrum shown in FIG. 9 has a prominent peak having a peak top at a wavenumber of about 1,400 cm⁻¹ (hereinafter also referred to as a peak at a wavenumber of about 1,400 cm⁻¹), and a minute peak having a peak top at a wavenumber of about 2,600 cm⁻¹ (hereinafter also referred to as a peak at a wavenumber of about 2,600 cm⁻¹), and the measured reflection spectrum almost matches the calculated reflection spectrum in the wavenumber range other than the area where these peaks are observed.

The reflection spectrum, that is, a baseline of the measured reflection spectrum in the case where no point defect-caused peak is observed, can be expressed by the calculated reflection spectrum. The peak height of a given peak is defined as a difference between intensity reflectance at the peak top of this peak and intensity reflectance at a baseline at the wavenumber corresponding to this peak top. In the example shown in FIG. 9, the intensity reflectance at the peak top is 33%, and the baseline intensity reflectance corresponding thereto is 12% for a peak with a wavenumber of about 1,400 cm⁻¹, and therefore the peak height is 21%. Further, the peak top intensity reflectance at the peak top is 16% and the baseline intensity reflectance corresponding thereto is 14% for a peak with a wavenumber of about 2,600 cm⁻¹, and therefore the peak height is 2%.

A lower limit value of the peak height may be provided in order to determine presence or absence of the peak. For example, when there is a peak height of 1% or more as the deviation of the intensity reflectance from the calculated reflectance spectrum in the measured reflectance spectrum, it may be determined that the measured reflection spectrum has a peak, and when there is no peak height of 1% or more, it may be determined that the measured reflection spectrum does not have a peak.

In the baseline of the measured reflection spectrum, change in intensity reflectance is gradual within a wavenumber range of 1,000 cm$^{-1}$ or more (for example, 3,000 cm$^{-1}$ or less). Accordingly, the peak appearing in this wavenumber range is easy to detect, and can be easily used as an index for inspecting the quality of the GaN crystal constituting the substrate 10.

When the inventor of the present application measures the reflection spectra for a plurality of substrates 10, there is also a substrate 10 that shows a reflection spectrum without peaks, as shown in FIG. 8, and there is also a substrate 10 that shows a reflection spectrum with peaks as shown in FIG. 9. In the substrate 10 that shows a reflection spectrum having a peak, peaks having wavenumbers of various peak tops are observed. Among them, a peak having a peak top at a wavenumber of about 1,400 cm$^{-1}$ (a peak at a wavenumber of about 1,400 cm$^{-1}$) as shown in FIG. 9 is noteworthy as it has been found that observed frequency is high and the peak height can be as high as 30% or more.

Details are unknown but as one possibility, the peak at the wavenumber of about 1,400 cm$^{-1}$ is considered to be caused by any point defect generated in the GaN crystal constituting the substrate 10, for example, is considered to be caused by infrared absorption by single bond (C—N) between carbon (C) that enter into a gallium (Ga) site, and nitrogen (N). The wavenumber range in which infrared absorption by C—N appears is said to be 1,220 cm$^{-1}$ or more and 1,416 cm$^{-1}$ or less, and is close to the wavenumber range in which the peak at a wavenumber of about 1,400 cm$^{-1}$ is observed on the substrate 10. Based on such finding, here, the peak at the wavenumber of about 1,400 cm$^{-1}$ in the substrate 10 is defined as a peak having a peak top within a wavenumber range of 1,200 cm$^{-1}$ or more and 1,500 cm$^{-1}$ or less. It is theoretically shown that the intensity reflectance R is increased, as the infrared absorption at a certain wavenumber is increased.

In the substrate 10, it is most preferable that the peak at the wavenumber of about 1,400 cm$^{-1}$ is not detected. However, even if such a peak is detected, it is acceptable if the peak height is not excessive. As described above, the concentration of C in the substrate 10 can be reduced to less than 5×10$^{15}$ at·cm$^{-1}$. In the reflection spectra measured for a plurality of substrates 10 having such C concentration, it is found that the maximum of the peak height of the peak at the wavenumber of about 1,400 cm$^{-1}$ is, for example, 32% (peak reflectance 44% at peak top, intensity reflectance 12% at baseline). Based on such finding, the peak height of the peak at the wavenumber of about 1,400 cm$^{-1}$ is, for example, preferably 35% or less, more preferably 30% or less, and still more preferably 25% or less. In order to quantitatively detect nondestructively and noncontactly C at a concentration of less than 5×10$^{15}$ at·cm$^{-3}$ contained in the substrate 10, the peak may be used. From a viewpoint of making the quality of the substrate 10 uniform in the plane, the variation of the peak height in the main surface of the substrate 10 is preferably 1.5 times or less as described later, for example.

If there is no point defect that is considered to be the cause of the peak at a wavenumber of about 1,400 cm$^{-1}$, it is assumed that the peak does not occur, and it is assumed that the peak height of the peak is increased as the point defect density is increased. Accordingly, based on this peak height of the peak, it is considered possible to estimate a point defect density which is the cause of the peak.

(2) Method of Manufacturing a Nitride Crystal Substrate

Figure 10:
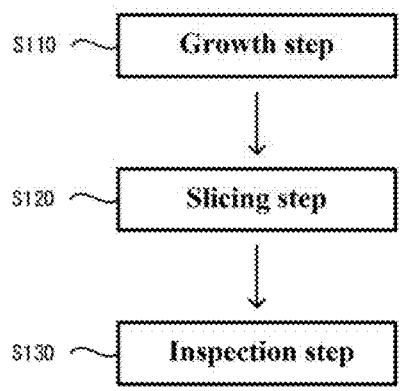
FIG. 10 is a flowchart showing a schematic procedure of a method of manufacturing the nitride crystal substrate 10 according to an embodiment of the present invention.

Next, a method of manufacturing the substrate 10 according to the present embodiment will be described. As shown in FIG. 10, the method of manufacturing the substrate 10 of the present embodiment includes a growth step S110, a slicing step S120, and an inspection step S130.

(2-i) Growth Step

In the growth step S110, the GaN crystal that constitutes the substrate 10 is grown, for example, using a hydride vapor phase growth apparatus (HIM apparatus) 200.

(Configuration of HVPE Apparatus)

Here, the configuration of the HVPE apparatus 200 used to manufacture the substrate 10 will be described in detail with reference to FIG. 11.

The HVPE, apparatus 200 includes an airtight container 203 in which a film forming chamber 201 is constituted. In the film forming chamber 201, an inner cover 204 is provided, and a susceptor 208 as a base on which a seed crystal substrate (hereinafter, also referred to as a "seed substrate") 5 is disposed at a position surrounded by the inner cover 204. The susceptor 208 is connected to a rotation shaft 215 of a rotation mechanism 216, and is constituted to be rotatable according to a drive of the rotation mechanism 216.

A gas supply pipe 232a for supplying hydrogen chloride (HCl) gas into a gas generator 233a, a gas supply pipe 232b for supplying ammonia (NH$_3$) gas into the inner cover 204, a gas supply pipe 232c for supplying a doping gas described later into the inner cover 204, a gas supply pipe 232d for supplying mixed gas (N$_2$/H$_2$ gas) of nitrogen (N$_2$) gas and hydrogen (H$_2$) gas as a purge gas into the inner cover 204, and a gas supply pipe 232e for supplying N$_2$ gas as a purge gas into the film forming chamber 201, are connected to one end of the airtight container 203. Flow controllers 241a to 241e and valves 243a to 243e are provided, respectively on the gas supply pipes 232a to 232e, sequentially from an upstream side. A gas generator 233a containing Ga melt as a raw material is provided on a downstream of the gas supply pipe 232a, A nozzle 249a is provided in the gas generator 233a, for supplying gallium chloride (GaCl) gas generated by a reaction of HCl gas and Ga melt toward the seed substrate 5 and the like disposed on the susceptor 208. Nozzles 249b and 249c are connected respectively on the downstream of the gas supply pipes 232b and 232c, for supplying various gases supplied from these gas supply pipes toward the seed substrate 5 and the like disposed on the susceptor 208. The nozzles 249a to 249c are disposed to flow the gas in a direction intersecting the surface of the susceptor 208. Doping gas supplied from the nozzle 249c is a mixed gas of a doping source gas and a carrier gas such as N$_2$/H$_2$ gas. The doping gas may be flowed together with HCl gas for the purpose of suppressing a thermal decomposition of a halide gas of a doping material. As a doping source gas constituting the doping gas, for example, dichlorosilane (SiH$_2$Cl$_2$) gas or silane (SiH$_4$) gas in the case of silicon (Si) doping, dichlorogermane (GeCl$_4$) gas or germane (GeH$_4$) gas in the case of germanium (Ge) doping, may be respectively used. However, the present invention is not limited to these gases.

An exhaust pipe 230 is provided at the other end of the airtight container 203, for exhausting inside of the film forming chamber 201. A pump (or blower) 231 is provided on the exhaust pipe 230. Zone heaters 207a and 207b are provided on the outer periphery of the airtight container 203, for heating the seed substrate 5 or the like in the gas generator 233a or on the susceptor 208 to a desired temperature for each region. Further, a temperature sensor (not shown) is provided in the airtight container 203, for measuring the temperature in the film forming chamber 201.

The constituent members of the HVPE apparatus 200 described above, particularly, the respective members for forming the flow of the various gases, are constituted for example as described below, in order to enable crystal growth with low impurity concentration as described later.

Specifically, as shown distinguishably by hatching types in it is preferable to use a member containing quartz-free and boron-free materials, as a member constituting a region heated to a crystal growth temperature (for example, 1,000° C. or more) by receiving radiation from the zone heaters 207a and 207b, which is a region where gas supplied to the seed substrate 5 comes into contact. Specifically, for example, it is preferable to use a member containing silicon carbide (SiC)-coated graphite, as a member constituting the high temperature region. On the other hand, in a relatively low temperature region, it is preferable to configure the member using high-purity quartz. Namely, in the high temperature region where it is relatively hot and in contact with HO gas etc., each member is constituted using the SiC-coated graphite without using the high-purity quartz. Specifically, the inner cover 204, susceptor 208, rotating shaft 215, gas generator 233a, nozzles 249a to 249c, etc., are constituted using the SiC-coated graphite. Since a furnace core tube constituting the airtight container 203 can only be quartz, the inner cover 204 is provided in the film forming chamber 201, for surrounding the susceptor 208, the gas generator 233a, and the like. The wall part at the both ends of the airtight container 203, the exhaust pipe 230, etc., may be constituted using metal materials, such as stainless steel.

For example, "Polyakov et al. J. Appl. Phys. 115, 183706 (2014)" discloses that growth at 950° C. enables growth of a low impurity concentration GaN crystal. However, such a low-temperature growth leads to a decrease in the quality of the crystal obtained, and it is not possible to obtain a good thermal property, electrical property, and the like.

In contrast, according to the above-described HYPE apparatus 200 of the present embodiment, each member is constituted using the SiC-coated graphite in the high temperature region where it is relatively hot and in contact with HCl gas, etc. Thereby, for example, even in a temperature range suitable for the growth of GaN crystal of 1,050° C. or more, supply of impurities to a crystal growth portion can be blocked, the impurities being Si, O, C, Fe, Cr, Ni, etc., derived from quartz, stainless steel, and the like. As a result, it is feasible to grow the GaN crystal having high purity and excellent properties in thermophysical properties and electrical properties.

Each member included in the HVPE apparatus 200 is connected to a controller 280 constituted as a computer, and a processing procedure and a processing condition described later are controlled by a program executed on the controller 280.

The growth step S110 includes a loading step, a crystal growth step, and an unloading step. Details are described below.

(Loading Step)

In this step, first, a furnace port of the reaction vessel 203 is opened, and the seed substrate 5 is placed on the susceptor 208. The seed substrate 5 placed on the susceptor 208 becomes a base (seed) for manufacturing the substrate 10, and is a plate constituted by a single crystal of GaN which is an example of a nitride semiconductor.

In placing the seed substrate 5 on the susceptor 208, the surface of the seed substrate 5 placed on the susceptor 208, namely, the main surface (crystal growth surface, base surface) on the side facing the nozzles 249a to 249c is (0001) plane of the GaN crystal, namely, +C plane (Ga polar plane).

(Crystal Growth Step)

In this step, after loading of the seed substrate 5 into the reaction chamber 201 is completed, the furnace port is closed, and supply of $H_2$ gas or $H_2$ gas and $N_2$ gas into the reaction chamber 201 is started while heating and exhausting inside of the reaction chamber 201. Then, supply of HCl gas and $NH_3$ gas is started from the gas supply pipes 232a and 232b in a state where temperature and pressure inside of the reaction chamber 201 reaches a desired processing temperature and processing pressure, and atmosphere in the reaction chamber 201 becomes a desired atmosphere, and GaCl gas and $NH_3$ gas are respectively supplied to the surface of the seed substrate 5.

Figure 12A:
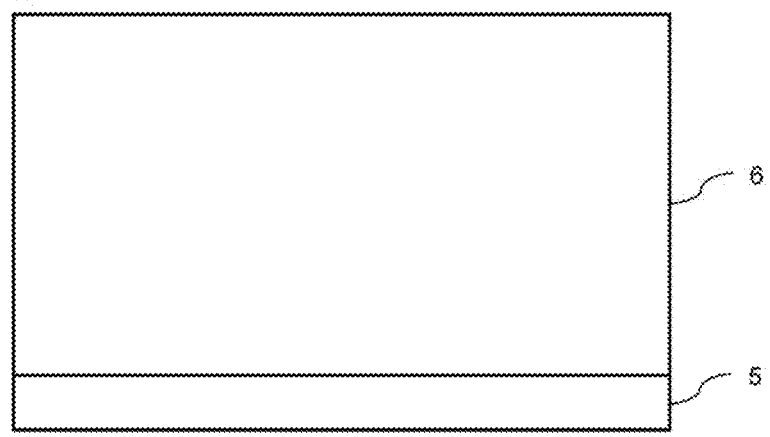
FIG. 12A is a view showing how the GaN crystal film 6 is grown thick on a seed crystal substrate 5.

Thereby, as shown in a sectional view in FIG. 12A, the GaN crystal is epitaxially grown on the surface of the seed substrate 5 in the c-axis direction, and GaN crystal 6 is formed. At this time, by supplying $SiH_2Cl_2$ gas, it is possible to add Si as an n-type impurity into the GaN crystal 6.

In this step, in order to prevent thermal decomposition of the GaN crystals constituting the seed substrate 5, it is preferable to start supply of the $NH_3$ gas into the reaction chamber 201 when the temperature of the seed substrate 5 reaches 500° C. or before that time. Further, in order to improve the in-plane uniformity of the film thickness of the GaN crystal 6, this step is preferably performed with the susceptor 208 rotated.

In this step, the temperature of the zone heaters 207a and 207b is preferably set to, for example, to a temperature from 700 to 900° C. in the heater 207a that heats an upstream portion in the reaction chamber 201 including the gas generator 233a, and is preferably set to, for example, a temperature from 1,000 to 1,200° C. in the heater 207b that heats a downstream portion in the reaction chamber 201 including the susceptor 208. Thereby, the temperature of the susceptor 208 is adjusted to a predetermined temperature of 1,000 to 1,200° C. In this step, an internal heater (not shown) may be used in off state, but temperature control may be performed using an internal heater, as long as the temperature of the susceptor 208 is in a range from 1,000 to 1,200° C.

Other processing conditions of this step are shown below.
Processing pressure: 0.5 to 2 atm
GaCl gas partial pressure: 0.1 to 20 kPa
$NH_3$ gas partial pressure/GaCl gas partial pressure: 1 to 100
$H_2$ gas partial pressure/GaCl gas partial pressure: 0 to 100
$SiH_2Cl_2$ gas partial pressure: $2.5 \times 10^{-5}$ to $1.3 \times 10^{-3}$ kPa Further, when supplying GaCl gas and $NH_3$ gas to the surface of the seed substrate 5, $N_2$ gas as a carrier gas may be added from each of the gas supply pipes 232a to 232b. Since $N_2$ gas is added and the flow rate of the gas supplied from the nozzles 249a to 249b is adjusted, the distribution of a supply amount of the source gas on the surface of the seed substrate 5 is appropriately controlled, and a uniform growth rate distribution can be realized over an entire surface. A rare gas such as Ar gas or He gas may be added instead of $N_2$ gas.

(Unloading Step)

When the GaN crystal 6 having a desired thickness is grown on the seed substrate 5, supply of the HCl gas to the gas generator 233a, supply of the $H_2$ gas into the reaction chamber 201, and heating by the zone heaters 207a and 207b are respectively stopped, while supplying $NH_3$ gas and $N_2$ gas into the reaction chamber 201, with the reaction chamber 201 exhausted. Then, when the temperature in the reaction chamber 201 is lowered to 500° C. or less, supply of the NH₃ gas is stopped, and the atmosphere in the reaction chamber 201 is replaced with N₂ gas to return to the atmospheric pressure. Then, the temperature inside of the reaction chamber 201 is lowered to, for example, to 200° C. or less, namely, to a temperature at which the crystal ingot of GaN (seed substrate 5 with the GaN crystal 6 formed on the main surface) can be unloaded from the reaction vessel 203. Thereafter, the crystal ingot is unloaded from the reaction chamber 201 to outside.

(2-ii) Slicing Step

Figure 12B:
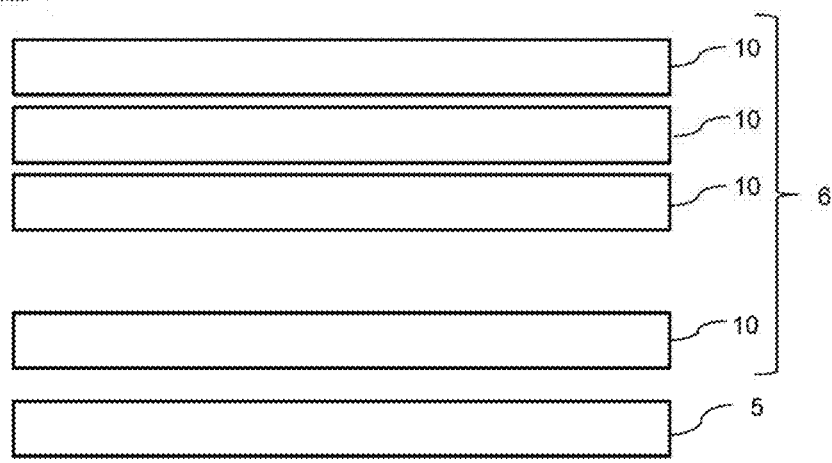
FIG. 12B is a view showing how a plurality of nitride crystal substrates 10 are obtained by slicing a thickly grown GaN crystal film 6.

After the growth step S110, a slicing step S120 is performed. In the slicing step S120, the unloaded crystal ingot is sliced, for example, in a direction parallel to a growth surface of the GaN crystal 6. Thereby, as shown in FIG. 12B, one or more substrates 10 can be obtained. Since various compositions and various physical properties of the substrate 10 are as described above, description thereof is omitted. A slicing process can be performed using, for example, a wire saw or an electric discharge machine, etc. The thickness of the substrate 10 is 250 μm or more, for example, about 400 μm. Thereafter, by performing a predetermined polishing process on the surface (+c plane) of the substrate 10, this surface becomes an epi-ready mirror surface.

The substrate 10 having the above-described relationship represented by formula (1) between the carrier concentration and the absorption coefficient in the infrared region, can be produced through the growth step S110 and the slicing step S120. In the inspection step S130 described below, a step of inspecting whether the substrate 10 has the above relationship may be added. The growth step S110 and the slicing step S120 may be collectively considered as a preparation step of preparing the substrate 10 to be inspected in the inspection step S130.

(2-iii) Inspection Step

In the inspection step S130, the quality of the GaN crystal constituting the substrate 10 is inspected using a reflective FTIR method. The inspection step S130 includes a measurement step and a determination step. Details are described below.

(Measurement Step)

By irradiating each of the plurality of produced substrates 10 with infrared light, a reflection spectrum is measured by the reflection type FTIR method. The reflection spectrum is measured at least at one position in the main surface of each substrate 10. Fitting as described above is performed to the measured reflection spectrum, to thereby obtain the carrier concentration $N_{IR}$ and mobility $\mu_{IR}$ of the substrate 10. Further, it is examined whether or not the measured reflection spectrum has a peak having a peak top (peak having a wave number of about 1,400 cm⁻¹) within a wave number range of 1,200 cm⁻¹ to 1,500 cm⁻¹. When the peak is detected, its peak height is measured. The point defect density of the substrate 10 may be obtained based on the peak height. If necessary, inspection for the presence of peaks, measurement of peak height, and the like may be performed for peaks other than the peak at the wave number of about 1,400 cm⁻¹.

When inspecting the in-plane distribution of the quality of each substrate 10 in the main surface, the reflection spectrum measured at each of a plurality of positions in the main surface of each substrate 10, and based on the reflection spectrum measured at each of the plurality of positions, various physical properties representing the quality of the substrate 10 are measured (carrier concentration $N_{IR}$ and mobility $\mu_{IR}$, peak presence/absence, peak height, etc.).

(Determination Step)

Next, it is determined whether the carrier concentration $N_{IR}$ and mobility $\mu R$ of each substrate 10 are within a predetermined allowable range, and the substrate 10 having the carrier concentration $N_{IR}$ and the mobility $\mu_{IR}$ within the allowable range is selected. Further, it is determined whether or not the measured reflection spectrum of each substrate 10 has a peak at a wave number of about 1,400 cm⁻¹, and the substrate 10 having no peak, and the substrate 10 having a peak height within a predetermined allowable range even if it has the peak, are selected. The substrate 10 having no peak may be selected as a best product.

When the in-plane distribution is inspected, small and large of the variation of a focused physical property in the main surface of each substrate 10 is determined, and the substrate 10 that does not have excessive variation is selected. The variation of the physical property in the main surface is evaluated as follows, for example. The variation is defined by, for example, the ratio of a maximum physical property value to a minimum physical property value in the main surface, and when this ratio is, for example, 1.5 times or less, it is determined that the variation is not excessive. For example, when the variation of the peak height of a peak at a wave number of about 1,400 cm⁻¹ is evaluated, peak heights obtained at each of a plurality of positions in the main surface of each substrate 10 are compared, and it is determined whether the ratio of the maximum to the minimum peak height is 1.5 times or less.

The inspection result obtained by the inspection step S130 may be used for determining suitability of various processing conditions when manufacturing the substrate 10, and determining whether or not there is an abnormality in an apparatus such as the HVPE apparatus 200 used for manufacturing the substrate 10.

In this way, the substrate 10 of the present embodiment is manufactured. Thereafter, a semiconductor laminate is manufactured by growing a semiconductor layer on the substrate 10 selected as a non-defective product. Further, a semiconductor device is manufactured by performing a step of forming an electrode on the semiconductor laminate. When the semiconductor device is manufactured using the substrate 10, the substrate 10 is heated by infrared irradiation, for example, in a semiconductor layer growth, activation annealing, protective film formation, ohmic alloy steps, etc. The semiconductor device to be manufactured is not particularly limited, and for example, a Schottky barrier diode (SBD), a light emitting diode, a laser diode, a junction barrier Schottky diode (JBS), a bipolar transistor, or the like may be used. The configuration of the semiconductor laminate may be appropriately selected according to the semiconductor device to be manufactured. Further, a method for growing the semiconductor layer for forming the semiconductor laminate may also be selected as appropriate.

(3) Effect Obtained by the Present Embodiment

According to the present embodiment, one or more of the following effects can be obtained.

(a) The substrate 10 manufactured by the manufacturing method of the present embodiment has a small crystal strain, and is in a state where impurities other than O and n-type impurities (for example, impurities that compensate for the n-type impurities) are hardly included. Thereby, in the substrate 10 of the present embodiment, the absorption coefficient $\alpha$ in the wavelength range of at least 1 μm or more and 3.3 μm or less can be approximately expressed by equation (1) ($\alpha = N_e K \lambda^a$) using the predetermined constant K and constant a.

As a result, heating conditions in the step of heating the substrate 10 by irradiating the substrate 10 with at least infrared rays can be easily, set, and the substrate 10 can be heated with high accuracy and good reproducibility.

(b) As a result, the reflectance spectrum measured by the FTIR method on the substrate 10 and the reflection spectrum calculated from theoretical formula, can be fitted with high accuracy. Thereby, the carrier concentration $N_{IR}$ and the mobility $\mu_{IR}$ of the substrate 10 can be accurately, measured. Further thereby, the above-described point defect-caused peak can be detected clearly as a deviation of the measured reflection spectrum from the calculated reflection spectrum. Thus, by using the substrate 10 of the present embodiment, the quality of the GaN crystal constituting the substrate 10 can be properly inspected based on the measured reflection spectrum.

Among the point defect-caused peaks that can appear in the measured reflection spectrum, for example, a peak having a peak top in a wave number range of 1,200 cm$^{-1}$ or more and 1,500 cm$^{-1}$ or less (a peak at a wave number of about 1,400 cm$^{-1}$) can be given as a prominent one. It is most preferable that the peak at a wave number of about 1,400 cm$^{-1}$ is not detected. However, even if the peak is detected, such a peak is allowed if the peak height is not excessive (for example, 35% or less).

For your reference, in the GaN crystal manufactured by conventional manufacturing method, it is difficult to approximately express the absorption coefficient α by equation (1) with high accuracy using the above-defined constant K and constant a.

Figure 5B:
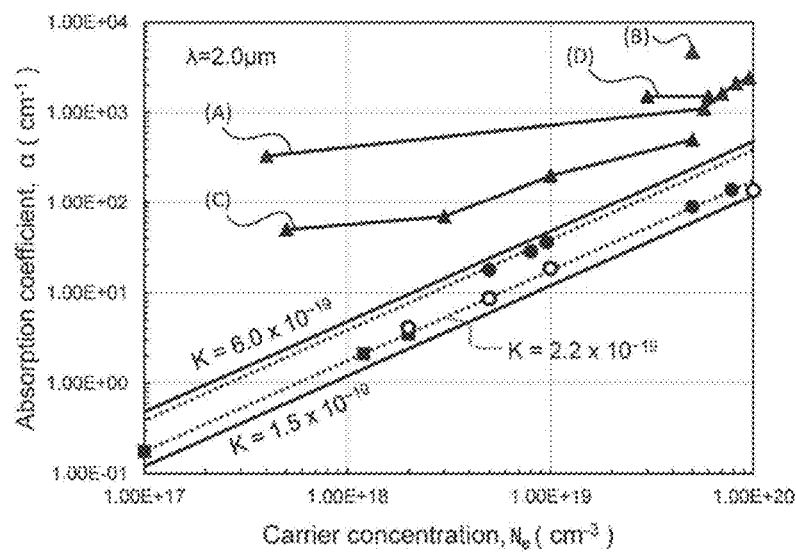
FIG. 5B is a view comparing the relationship between the free electron concentration and the absorption coefficient at a wavelength of 2 μm.

Here, FIG. 5B is a view for comparing the relationship of the absorption coefficient at a wavelength of 2 μm with respect to the free electron concentration. FIG. 5B shows not only the absorption coefficient of the GaN crystal manufactured by the manufacturing method of the present embodiment, but also the absorption coefficient of the GaN crystal described in the papers (A) to (D).

Paper (A): A. S. Barker Physical Review B 7 (973) p 743 FIG. 8

Paper (B): Perlin, Physics' Review Letter 75 (995) p 296 FIG. 1 Estimated from 0.3 GPa curve.

Paper (C): G. Bentoumi, Material Science Engineering B50 (1997) p 142-147, FIG. 1

Paper (D): S. M. Porowski, J. A. Crystal Growth 189-190 (19.98) p. 153-158 FIG. 3 However, T=12 K As shown in FIG. 5B, the absorption coefficient α in the conventional GaN crystal described in the papers (A) to (D) was larger than the absorption coefficient α of the GaN crystal manufactured by the manufacturing method of the present embodiment. Further, the slope of the absorption coefficient α in the conventional GaN crystal was different from the slope of the absorption coefficient α of the GaN crystal manufactured by the manufacturing method of the present embodiment. In the papers (A) and (C), it was also seen that the slope of the absorption coefficient α changed as the free electron concentration $N_e$ increased. Therefore, in the conventional GaN crystal described in the papers (A) to (D), it has been difficult to accurately approximately express the absorption coefficient α by equation (1) using the above defined constant K and constant a. Specifically, for example, there is a possibility that the constant K is higher than the above-described defined range, or the constant a is a value other than 3.

This is considered to be due to the following reasons. It is considered that a large crystal strain occurred in the conventional GaN crystal due to the manufacturing method. When the crystal strain occurs in the GaN crystal, dislocations increase in the GaN crystal. Therefore, in the conventional GaN crystal, it is considered that dislocation scattering occurred and the absorption coefficient α was increased or varied due to the dislocation scattering. Or, in the GaN crystal manufactured by the conventional manufacturing method, it is considered that the concentration of O that was mixed unintentionally was high. When O is mixed at a high concentration in the GaN crystal, the lattice constants a and c of the GaN crystal increase (Reference: Chris G. Van de Walle, Physical Review B vol. 68, 165209 (2003)). Therefore, in the conventional GaN crystal, a local lattice mismatch occurs between a portion contaminated by O and a relatively pure portion, and it is considered that the crystal strain occurred in the GaN crystal. As a result, in the conventional GaN crystal, it is considered that the absorption coefficient α increases or varies. Or, in the GaN crystal manufactured by the conventional manufacturing method, it is considered that the p-type compensation impurity for compensating the n-type impurity was mixed unintentionally and the concentration of the compensation impurity was high. If the concentration of the compensation impurity is high, a high concentration of n-type impurities is required in order to obtain a predetermined free electron concentration. Therefore, in the conventional GaN crystal, it is considered that a total impurity concentration including the compensation impurity and the n-type impurity is increased, and the crystal strain is increased. As a result, in the conventional GaN crystal, it is considered that the absorption coefficient α increases or varies. In a GaN free-standing substrate actually containing O and having a lattice strain, it has been confirmed that the absorption coefficient α is high (low mobility) compared to the substrate 10 of the present embodiment having the same free electron concentration.

For this reason, in the conventional GaN crystal, it has been difficult to accurately approximately express the absorption coefficient α by equation (1) using the above defined constant K and constant a. Namely, in the conventional GaN crystal, it is difficult to design the absorption coefficient with high accuracy based on the free electron concentration $N_e$. Therefore, in the substrate constituted by the conventional GaN crystal, heating efficiency easily varies depending on the substrate, and it has been difficult to control a substrate temperature in the step of heating the substrate by irradiating the substrate with at least infrared rays. As a result, there was a possibility that the temperature reproducibility for each substrate would be low. Further, if the absorption coefficient α becomes excessively large or varies in this way, the extinction coefficient k becomes excessively large or varies. Therefore, in the conventional GaN crystal, the reflection spectrum measured by the FTIR method cannot be obtained in the shape almost matches the reflection spectrum calculated from the theoretical formula, due to the variation of the extinction coefficient k.

In contrast, the substrate 10 manufactured by the manufacturing method of the present embodiment is in a state where crystal strain is small and almost no impurities other than O and n-type impurities are contained. The absorption coefficient of the substrate 10 of the present embodiment is less affected by scattering due to crystal strain (dislocation scattering) and mainly depends on ionized impurity scattering. Thereby, variation of the absorption coefficient α of the substrate 10 can be reduced, and the absorption coefficient α of the substrate 10 can be approximately expressed by the above equation (1) using the predetermined constant K and constant a.

Since the absorption coefficient α of the substrate 10 can be approximately expressed by the equation (1), the absorption coefficient of the substrate 10 can be designed with high accuracy based on the concentration $N_e$ of the free electrons generated by doping the substrate 10 with n-type impurities. Since the absorption coefficient of the substrate 10 can be designed with high accuracy based on the free electron concentration $N_e$, the heating condition can be easily set, and the temperature of the substrate 10 can be controlled with high accuracy in the step of heating the substrate 10 by irradiating the substrate 10 with at least infrared rays. As a result, the temperature reproducibility for each substrate 10 can be improved. Thus, in the present embodiment, it becomes possible to heat the substrate 10 with high precision and good reproducibility.

Further, since the absorption coefficient of the substrate 10 is approximately expressed by equation (1) with high accuracy, the variation of the absorption coefficient α of the substrate 10 with respect to the free electron concentration $N_e$ in the substrate 10 can be suppressed. The suppression of the variation of the absorption coefficient α of the substrate 10 means that the variation of the extinction coefficient k is suppressed ($\alpha = 4\pi k/\lambda$). Accordingly, since the substrate 10 of the present embodiment is used, the reflection spectrum measured by the FTIR method can be appropriately obtained in a shape that substantially matches the reflection spectrum calculated from the theoretical formula. Then, based on the properly acquired reflection spectrum, the quality of the GaN crystal constituting the substrate 10 can be properly inspected.

(c) The in-plane absorption coefficient difference Δα of the substrate 10 of the present embodiment preferably satisfies Δα≤1.0, Thereby, heating efficiency by infrared irradiation can be made uniform in the main surface of the substrate 10 in the step of heating the substrate 10, and therefore the quality of the semiconductor laminate manufactured using the substrate 10 can be made uniform in the main surface of the substrate 10. As a result, the quality and yield of the semiconductor device manufactured using the semiconductor laminate can be improved.

Then, due to the high uniformity of the absorption coefficient α in the main surface, it is possible to suppress the variation of the shape of the measured reflection spectrum in the main surface of the substrate 10, namely, the variation of a baseline shape of the reflection spectrum. Further, thereby, it becomes easy to compare point defect-caused peaks detected at a plurality of positions in the main surface.

OTHER EMBODIMENTS

The embodiments of the present invention have been specifically described above. However, the present invention is not limited to the above-described embodiment, and various modifications can be made without departing from the scope of the invention.

The above-described embodiment shows a case of using the reflection type FUR method to measure the infrared spectrum of the substrate 10. However, as a method other than the reflection type FTIR method, the same measurement can be performed by using a spectroscopic ellipsometry method.

The above-described embodiment shows a case of constituting the substrate 10 by GaN. However, the substrate 10 may also be constituted not only by GaN, but also by group-III nitrides such as AlN, aluminum gallium nitride (AlGaN), indium nitride (InN), indium gallium nitride (InGaN), aluminum indium gallium nitride (AlInGaN), namely, group-HI nitride represented by a composition formula of $Al_xIn_yGa_{1-x-y}N$ (0≤x≤1, 0≤y≤1, 0≤x+y≤1).

The above-described embodiment shows a case of manufacturing the substrate 10 using the seed substrate 5 constituted by GaN single crystal. However, the substrate 10 may be manufactured by the following method. For example, a GaN layer provided on a heterogeneous substrate such as a sapphire substrate is used as an underlayer, then, a crystal ingot on which the GaN layer is grown thickly through a nanomask or the like is peeled off from the heterogeneous substrate, and a plurality of substrates 10 may be cut out from the crystal ingot.

Preferred Aspects of the Present Invention (Supplementary Description 1)

There is provided a nitride crystal substrate constituted by group-Ill nitride crystal, containing n-type impurities, with an absorption coefficient α being approximately expressed by equation (1) by a least squares method in a wavelength range of at least 1 μm or more and 3.3 μm or less $$\alpha = N_e K \lambda^a \qquad (1)$$

(where $1.5 \times 10^{-19} \leq K \leq 6.0 \times 10^{-19}$, a=3), here, a wavelength is λ (μm), an absorption coefficient of the nitride crystal substrate at 27° C. is α ($cm^{-1}$), a carrier concentration in the nitride crystal substrate is $N_e$ ($cm^{-3}$), and K and a are constants, wherein an error of an actually measured absorption coefficient with respect to the absorption coefficient α obtained from equation (1) at a wavelength of 2 μm is within ±0.1α, and in a reflection spectrum measured by irradiating the nitride crystal substrate with infrared light, there is no peak with a peak top within a wavenumber range of 1,200 $cm^{-1}$ or more and 1,500 $cm^{-1}$ or less.

(Supplementary Description 2)

There is provided a nitride crystal substrate constituted by group-III nitride crystal, containing n-type impurities, with an absorption coefficient ac being approximately expressed by equation (1) by a least squares method in a wavelength range of at least 1 μm or more and 3.3 μm or less.

$$\alpha = N_e K \lambda^a \qquad (1)$$

(where $1.5 \times 10^{-19} \leq K \leq 6.0 \times 10^{-19}$, a=3)

here, a wavelength is λ (μm), an absorption coefficient of the nitride crystal substrate at 27° C. is α ($cm^{-1}$), a carder concentration in the nitride crystal substrate is $N_e$ ($cm^{-3}$), and K and a are constants, wherein an error of an actually measured absorption coefficient with respect to the absorption coefficient α obtained from equation (1) at a wavelength of 2 μm and is within ±0.1α, and in a reflection spectrum measured by irradiating the nitride crystal substrate with infrared light, there is a peak with a peak top within a wavenumber range of 1,200 $cm^{-1}$ or more and 1,500 $cm^{-1}$ or less, and a peak height which is a difference between an intensity reflectance of a peak top of the peak and an intensity reflectance of a baseline of the reflection spectrum is 35% or less, more preferably 30% or less, still more preferably 25% or less.

(Supplementary Description 3)

There is provided the nitride crystal substrate according to supplementary description 2, wherein a ratio of a maximum to a minimum of the peak height is 1.5 times or less in a main surface of the nitride crystal substrate.

(Supplementary Description 4)

There is provided the nitride crystal substrate according to any one of the supplementary descriptions 1 to 3, wherein $\Delta\alpha$ satisfies equation (3) in a wavelength range of 1 μm or more and 3.3 μm or less, $$\Delta\alpha \leq 1.0 \qquad (3)$$

here, a difference between a maximum value and a minimum value of the absorption coefficient $\alpha$ in a main surface of the nitride crystal substrate is $\Delta\alpha$.

(Supplementary Description 5)

There is provided the nitride crystal substrate according to any one of the supplementary descriptions 1 to 4, wherein the baseline of the measured reflection spectrum can be represented by a calculated reflection spectrum, using an optical model representing a configuration of the nitride crystal substrate, and a dielectric function model representing a dielectric function of the nitride crystal substrate, and the calculated reflection spectrum is the reflection spectrum obtained by setting a carrier concentration and mobility of the nitride crystal substrate in the optical model and the dielectric function model so that the calculated reflection spectrum is fitted to the measured reflection spectrum.

(Supplementary Description 6)

There is provided the nitride crystal substrate according to the supplementary description 5, wherein the dielectric function model is a Lorentz-prude model.

(Supplementary Description 7)

There is provided the nitride crystal substrate according to any one of the supplementary descriptions 1 to 6, wherein the group-III nitride is GaN.

(Supplementary Description 8)

There is provided a method for manufacturing a nitride crystal substrate, including:

preparing a nitride crystal substrate constituted by group-III nitride crystal, containing n-type impurities, with an absorption coefficient $\alpha$ being approximately expressed by equation (1) by a least squares method in a wavelength range of at least 1 μm or more and 3.3 μm or less.

$$\alpha = N_e K \lambda^a \qquad (1)$$

(where $1.5 \times 10^{-19} \leq K \leq 6.0 \times 10^{-19}$, a=3)

here, a wavelength is $\lambda$ (μm), an absorption coefficient of the nitride crystal substrate at 27° C. is $\alpha$ (cm$^{-1}$), a carrier concentration in the nitride crystal substrate is $N_e$ (cm$^{-3}$), and K and a are constants, wherein an error of an actually measured absorption coefficient is within $\pm 0.1\alpha$ with respect to the absorption coefficient $\alpha$ obtained from equation (1) at a wavelength of 2 μm; and measuring a reflection spectrum by irradiating the nitride crystal substrate with infrared light, and inspecting whether there is a peak with a peak top within a wavenumber range of 1,200 cm$^{-1}$ or more and 1,500 cm$^{-1}$ or less.

(Supplementary Description 9)

There is provided the method for manufacturing a nitride crystal substrate according to the supplementary description 8, including: measuring the reflection spectrum for each of a plurality of positions in a main surface of the nitride crystal substrate; obtaining a peak height, which is a difference between an intensity reflectance of the peak top of the detected peak and an intensity reflectance of a baseline of the reflection spectrum; and comparing the peak heights calculated for each of the plurality of positions.

(Supplementary Description 10)

There is provided the method for manufacturing a nitride crystal substrate according to supplementary description 8 or 9, wherein a point defect density of the nitride crystal substrate is estimated based on the peak height, which is the difference between the intensity reflectance of the peak top of the detected peak and the intensity reflectance of the baseline of the reflection spectrum.

(Supplementary Description 11)

There is provided the method for manufacturing a nitride crystal substrate according to any one of the supplementary descriptions 8 to 10, wherein the group III nitride is GaN,

What is claimed is:

1. A GaN free-standing substrate comprising GaN single crystal, containing n-type impurities, with an absorption coefficient $\alpha$ being approximated by equation (1) by a method of least squares in a wavelength range of at least 1 μm or more and 3.3 μm or less:

$$\alpha = N_e K \lambda^a, \qquad \text{equation (1)}$$

where $1.5 \times 10^{-19} \leq K \leq 6.0 \times 10^{-19}$, a=3, a wavelength being $\lambda$(μm), an absorption coefficient of the GaN free-standing substrate at 27° C. being $\alpha$(cm$^{-1}$), a carrier concentration in the GaN free-standing substrate being $N_e$ (cm$^{-3}$), and K and a being constants, wherein an error of an actually measured absorption coefficient with respect to the absorption coefficient $\alpha$ obtained from equation (1) at a wavelength of 2 μm is within $\pm 0.1\alpha$, and in a reflection spectrum measured by irradiating the GaN free-standing substrate with infrared light, there is a peak within a wavenumber range of 1,200 cm$^{-1}$ or more and 1,500 cm$^{-1}$ or less, and a peak height which is a difference between an intensity reflectance of the peak and an intensity reflectance of a baseline of the reflection spectrum is 35% or less, the baseline of the reflection spectrum is a reflection spectrum in a case where there is no point defect in the GaN free-standing substrate.

2. The GaN free-standing substrate according to claim 1, where $\Delta\alpha$ represents a difference between a maximum value and a minimum value of the absorption coefficient $\alpha$, when analyzed in a main surface of the GaN free-standing substrate by irradiation, the value of $\Delta\alpha \leq 1.0$ and the wavelength range is 1 μm or more and 3.3 μm or less.

3. A method for manufacturing a GaN free-standing substrate, comprising:

preparing a GaN free-standing substrate constituted by GaN single crystal, containing n-type impurities, with an absorption coefficient $\alpha$ being approximated by equation (1) by a method of least squares in a wavelength range of at least 1 μm or more and 3.3 μm or less:

$$\alpha = N_e K \lambda^a, \qquad \text{equation (1)}$$

where $1.5 \times 10^{-19} \leq K \leq 6.0 \times 10^{-19}$, a=3, a wavelength being $\lambda(\mu m)$, an absorption coefficient of the GaN free-standing substrate at 27° C. being $\alpha(cm^{-1})$, a carrier concentration in the GaN free-standing substrate being $N_e$ $(cm^{-3})$, and K and a being constants, wherein an error of an actually measured absorption coefficient is within $\pm 0.1\alpha$ with respect to the absorption coefficient $\alpha$ obtained from equation (1) at a wavelength of 2 µm; and measuring a reflection spectrum by irradiating the GaN free-standing substrate with infrared light, and inspecting whether there is a peak within a wavenumber range of 1,200 $cm^{-1}$ and 1,500 $cm^{-1}$ or less and a peak height which is a difference between an intensity reflectance of the peak and an intensity reflectance of a baseline of the reflection spectrum is 35% or less, the baseline of the reflection spectrum is a reflection spectrum in a case where there is no point defect in the GaN free-standing substrate.

4. The method for manufacturing a GaN free-standing substrate according to claim 3, comprising: measuring the reflection spectrum for each of a plurality of positions in a main surface of the GaN free-standing substrate; obtaining a peak height, which is a difference between an intensity reflectance of the detected peak and an intensity reflectance of a baseline of the reflection spectrum; and comparing the peak heights obtained for each of the plurality of positions.

5. The method for manufacturing a GaN free-standing substrate according to claim 3, wherein a point defect density of the GaN free-standing substrate is estimated based on a peak height, which is a difference between an intensity reflectance of the detected peak and an intensity reflectance of a baseline of the reflection spectrum.

* * * * *

UNITED STATES PATENT AND TRADEMARK OFFICE
CERTIFICATE OF CORRECTION

PATENT NO. : 12,104,279 B2
APPLICATION NO. : 17/649983
DATED : October 1, 2024
INVENTOR(S) : Fumimasa Horikiri It is certified that error appears in the above-identified patent and that said Letters Patent is hereby corrected as shown below:

In the Specification

Column 2, Line 9, delete "is λ(1), an" and insert --is λ(μm), an--.

Column 7, Line 9, delete "in the Gall crystal" and insert --in the GaN crystal--.

Column 18, Line 10, delete "apparatus (HIM apparatus)" and insert --apparatus (HVPE apparatus)--.

Figure 11:
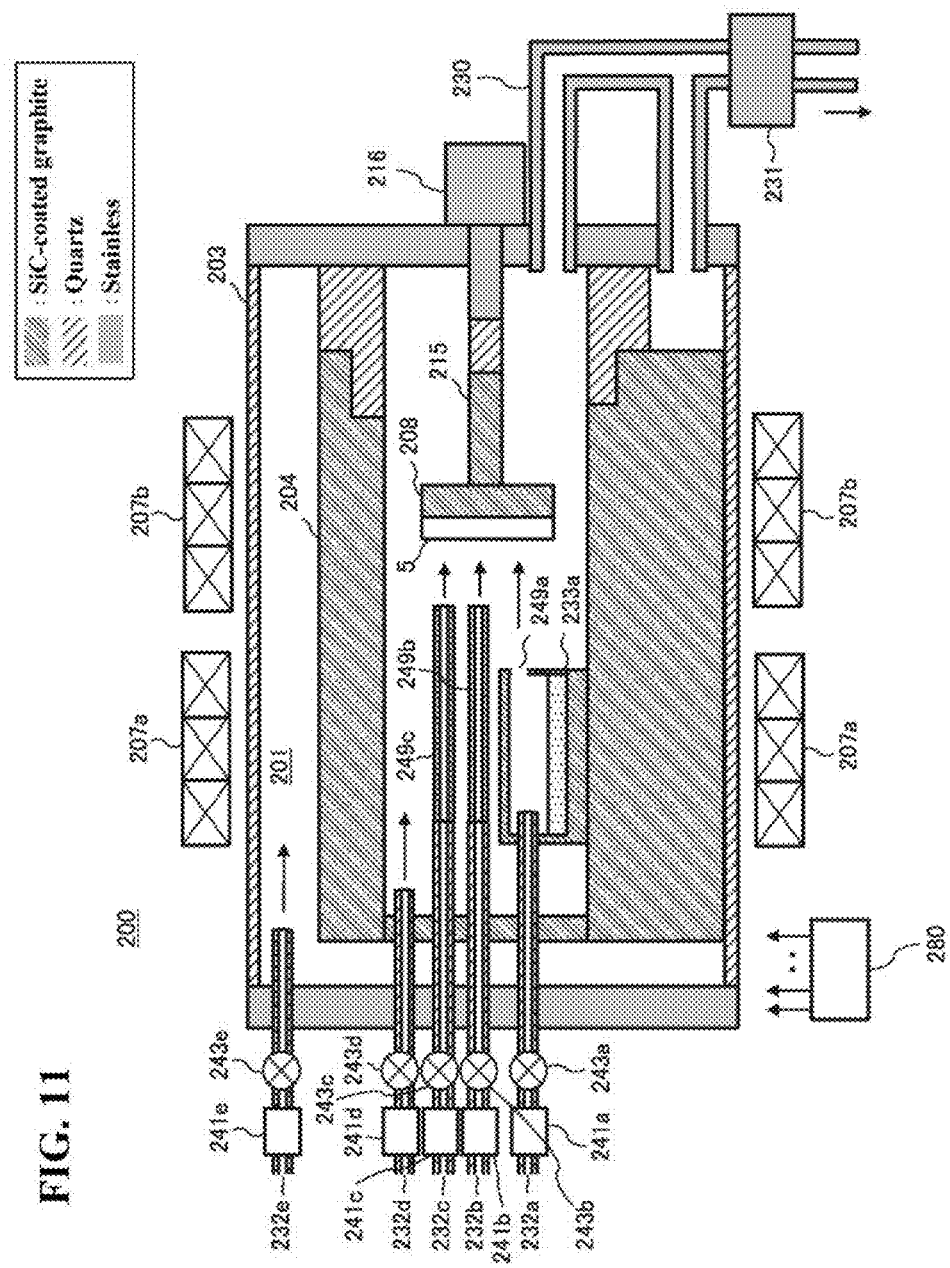
FIG. 11 is a schematic block view of an HVPE apparatus 200.

Column 19, Line 9, delete "in it is preferable" and insert --in FIG. 11, it is preferable--.

Column 19, Line 21, delete "with HO gas etc., each" and insert --with HCl gas etc., each--.

Column 19, Line 10, delete "above-described HYPE" and insert --above-described HVPE--.

Column 23, Line 38, delete "Review B 7 (973)" and insert --Review B 7 (1973)--.

Column 23, Line 40, delete "Letter 75 (995)" and insert --Letter 75 (1995)--.

Column 23, Line 45, delete "(19.98) p. 153-158 FIG. 3" and insert --(1998) p. 153-158 FIG. 3--.

Column 25, Line 55, delete "type FUR method to" and insert --type FTIR method to--.

Column 26, Line 42, delete "coefficient ac being" and insert --coefficient a being--.

Column 26, Line 52, delete "a carder" and insert --a carrier--.

Column 27, Line 35, delete "is a Lorentz-prude model." and insert --is a Lorentz-Drude model.--.

Signed and Sealed this
First Day of April, 2025

Coke Morgan Stewart
*Acting Director of the United States Patent and Trademark Office*

CERTIFICATE OF CORRECTION (continued)
U.S. Pat. No. 12,104,279 B2

In the Claims

Column 29, Line 13, Claim 3, delete "1,200 cm$^{-1}$ and 1,500cm$^{-1}$" and insert --1,200 cm$^{-1}$ or more and 1,500cm$^{-1}$--.